US008862086B2

(12) United States Patent
Schultz et al.

(10) Patent No.: US 8,862,086 B2
(45) Date of Patent: Oct. 14, 2014

(54) MIXER, MIXER SYSTEM AND METHOD

(75) Inventors: Christoph Schultz, Essen (DE);
Markus Hammes, Dinslaken (DE);
Rainer Kreienkamp, Duesseldorf (DE);
Stefan Van Waasen, Xanten (DE)

(73) Assignee: Intel Mobile Communicatons GmbH, Neubiberg (DE)

( * ) Notice: Subject to any disclaimer, the term of this patent is extended or adjusted under 35 U.S.C. 154(b) by 45 days.

(21) Appl. No.: 13/453,162

(22) Filed: Apr. 23, 2012

(65) Prior Publication Data

US 2012/0270518 A1    Oct. 25, 2012

(30) Foreign Application Priority Data

Apr. 21, 2011  (DE) .......................... 10 2011 007 920

(51) Int. Cl.
| H04B 7/00 | (2006.01) |
| H03D 7/14 | (2006.01) |
| H03D 7/16 | (2006.01) |
| H03D 7/12 | (2006.01) |

(52) U.S. Cl.
CPC ....... *H03D 7/1433* (2013.01); *H03D 2200/006* (2013.01); *H03D 7/165* (2013.01); *H03D 2200/0068* (2013.01); *H03D 7/125* (2013.01); *H03D 7/1483* (2013.01); *H03D 7/1458* (2013.01); *H03D 7/1441* (2013.01)

USPC ........... 455/256; 455/266; 455/307; 455/323; 455/341; 455/313

(58) Field of Classification Search
CPC ...................................... H03D 7/1433
USPC .................. 455/256, 266, 307, 323, 341, 313
See application file for complete search history.

(56) References Cited

U.S. PATENT DOCUMENTS

| 6,049,573 | A | 4/2000 | Song |
| 7,756,504 | B2 | 7/2010 | Rafi et al. |
| 8,417,189 | B2 * | 4/2013 | Noujeim et al. ............ 455/67.11 |
| 2007/0071132 | A1 * | 3/2007 | May et al. ..................... 375/322 |
| 2010/0048157 | A1 | 2/2010 | Carrera et al. |

OTHER PUBLICATIONS

Yohei Morishita, et al., "A Low-IF Direct Sampling Mixer with Complex Transfer Function for ISDB-T One Segment Applications", Proceedings of Asia-Pacific Microwave Conference 2010, p. 698-701.

* cited by examiner

*Primary Examiner* — Sanh Phu
(74) *Attorney, Agent, or Firm* — Eschweiler & Associates, LLC

(57) ABSTRACT

A mixer is configured to sample a received input signal at a predefined oscillator frequency to generate a sampled input signal, and to switch a polarity of the sampled input signal at a predefined polarity switching frequency to generate a polarity switched sampled input signal.

21 Claims, 16 Drawing Sheets

| Band | $f_c$/MHz | B/MHz |
|---|---|---|
| GPS L1C | 1575,42 | 20,46 |
| Galileo L1 | 1575,42 | 32,74 |
| GPS L5 | 1176,45 | 20,46 |
| Galileo E5a | 1176,45 | 24,55 |
| Glonass L1 | 1601,72 | 8,5 |

FIG 3A

MIXER, MIXER SYSTEM AND METHOD

CROSS-REFERENCE TO RELATED APPLICATIONS

This application claims priority to German Patent Application No. 102011007920.3-35, which was filed on Apr. 21, 2011, and is incorporated herein in its entirety by reference.

FIELD

Embodiments of the present invention provide a mixer as may be used, for example, in a receiver for simultaneously receiving two different bands. Further embodiments provide a mixer system comprising a plurality of such mixers.

BACKGROUND

In a typical mixer for receiving two different bands, a mixed frequency (mixing frequency) $f_s$ is selected as follows:

$$f_s \approx (f_1 + f_2)/2, \qquad (1)$$

wherein $f_1$ is the center frequency of a first signal to be received, and $f_2$ is the center frequency of a second signal to be received.

In this case, the intermediate frequency $f_{IF}$ is as follows:

$$f_{IF} \approx |f_1 - f_2|/2 \qquad (2)$$

and the bandwidth $B_{IF}$ is as follows:

$$B_{IF} = \max(B_1, B_2), \qquad (3)$$

wherein $B_1$ is the bandwidth of the first signal to be received, and $B_2$ is the bandwidth of the second signal to be received.

This minimizes the bandwidth of the signal that may be used (for a single downconversion mixer). On the one hand, in the case of a sampling mixer, a low-pass filter is easy to implement, on the other hand, this low-pass filter may allow the intermediate frequency $f_{IF}$ to pass. This would be disadvantageous for the filter performance (for example an attenuation within the stop band). Additionally, in a sampling mixer, an order of an IIR filter of the sampling mixer is typically limited to one, so that with a given bandwidth, there is no freedom in terms of filter design.

In summary, in a sampling receiver, a capacitance for low-pass filtering is typically used following the sampling mixer so as to prevent aliasing in the subsequent decimation process. If two bands are to be received simultaneously with one single downconversion (downmixing) operation, the intermediate frequency will typically be placed to be halfway between the two bands.

SUMMARY

One embodiment may have a mixer configured to sample a received input signal at a predefined oscillator frequency so as to switch a polarity of the sampled input signal at a predefined polarity switching frequency.

According to another embodiment, a mixer system may have a plurality of mixers, each of the mixers being configured to sample a received input signal at a predefined oscillator frequency and to switch a polarity of the sampled input signal at a predefined polarity switching frequency. The system includes a clock provider for providing to each mixer among the plurality of mixers an oscillator signal having a predefined oscillator frequency and a polarity switching signal having a predefined polarity switching frequency. The oscillator signals for different mixers are shifted in phase in relation to one another, and the polarity switching signals for different mixers are shifted in phase in relation to one another.

According to another embodiment, a method may have the steps of: sampling a received input signal at a predefined oscillator frequency, and switching a polarity of the sampled input signal at a predefined polarity switching frequency.

According to another embodiment, a mixer may have: a sampling stage configured to sample a received input signal at a predefined oscillator frequency so as to acquire a sampled input signal, and a polarity switch configured to switch a polarity of the sampled input signal at a predefined polarity switching frequency.

According to another embodiment, a mixer may have a sampling stage configured to sample a received input signal at a predefined oscillator frequency of an applied oscillator signal, and to maintain, during sampling, a polarity of the sampled input signal with regard to the received input signal when the oscillator signal is present at a first oscillator signal input of the sampling stage. The sampling stage is also configured to switch, during sampling, a polarity of the sampled input signal with regard to the received input signal when the oscillator signal is present at a second oscillator signal input of the sampling stage. The mixer further comprises a switching signal provider configured to alternately apply the oscillator signal having a predefined polarity switching frequency at the first oscillator signal input of the sampling stage and at the second oscillator signal input of the sampling stage.

Embodiments provide a mixer configured to sample a received input signal at a predefined oscillator frequency so as to switch a polarity of the sampled signal at a predefined polarity switching frequency.

Further embodiments provide a mixer system comprising a plurality of mixers, each of the mixers being configured to sample a received input signal at a predefined oscillator frequency and to switch a polarity of the sampled input signal at a predefined polarity switching frequency. In addition, the mixer system comprises a clock provision means configured to provide to each mixer among the plurality of mixers an oscillator signal having a predefined oscillator frequency and a polarity switching signal having a predefined polarity switching frequency. Oscillator signals for different mixers are shifted in phase in relation to one another, and polarity switching signals for different mixers are shifted in phase in relation to one another.

BRIEF DESCRIPTION OF THE DRAWINGS

Embodiments of the present invention will be detailed subsequently referring to the appended drawings, in which:

FIG. 3a shows a table which depicts various frequency bands of global satellite navigation systems with their associated center frequencies and bandwidths;

FIG. 4a shows an equivalent circuit diagram of a possible realization, in terms of circuitry, of the mixer shown in FIG. 2a;

FIG. 5b shows a block diagram of a possible implementation of the mixer system shown in FIG. 5a while utilizing the mixers shown in FIG. 2a;

DETAILED DESCRIPTION

Figure 1:
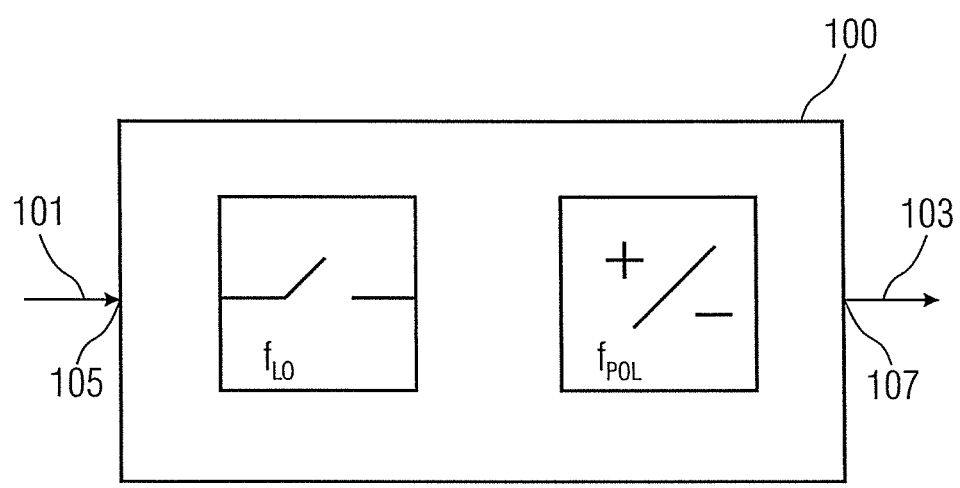
FIG. 1 shows a block diagram of a mixer in accordance with an embodiment.

Before embodiments of the present invention will be explained in detail below with reference to the accompanying figures, it shall be noted that identical elements or elements having identical functions are provided with the same reference numerals and that repeated descriptions of said elements shall be omitted. Descriptions of elements provided with the same reference numerals are therefore mutually exchangeable.

FIG. 1 shows a block diagram of a mixer 100 in accordance with an embodiment. The mixer 100 is configured to sample a received input signal 101 at a predefined oscillator frequency $f_{LO}$ and to switch a polarity of the sampled input signal 103 at a predefined polarity switching frequency $f_{POL}$.

Due to the additional switching of the polarity of the sampled input signal 103 at the polarity switching frequency $f_{POL}$, upon simultaneous reception of two signals in the input signal 101 (at different center frequencies), an intermediate frequency may be freely selected for each of said two signals. In other words, a frequency at which the first signal is downconverted may be arbitrarily chosen to be any frequency at which the second signal is downconverted. This enables a selection of a low-pass filter of the mixer 100 which has a clearly reduced bandwidth than is the case in systems wherein both signals are downconverted at one and the same frequency. In the event of a smaller bandwidth of such a low-pass filter, a clearly increased attenuation may be achieved within a stop band of the filter as compared to a low-pass filter having a larger bandwidth.

Switching of the polarity of the sampled input signal 103 at a constant period and/or at the predefined polarity switching frequency $f_{POL}$ acts as a second downconversion operation, which clearly reduces the intermediate frequency (IF). As a result, a clearly reduced bandwidth may be achieved for subsequent low-pass filtering of the sampled input signal 103 and, thus, utilization of a filter having higher attenuation within the stop band is made possible.

Switching of the polarity at the polarity switching frequency $f_{POL}$ may be considered, in the time domain, as a multiplication by a square-wave signal which is free from any direct component and has the switching frequency $f_{POL}$, and may therefore be considered, within the frequency range, as a convolution with a sampled Sin (x)/x. The oscillator frequency $f_{LO}$ and the polarity switching frequency $f_{POL}$ may be selected such that a sum of the oscillator frequency and the switching frequency is close to a frequency range of the second signal and that a positive difference between the predefined oscillator frequency $f_{LO}$ and the polarity switching frequency $f_{POL}$ is close to a frequency range of the first signal.

In accordance with an embodiment, the oscillator frequency $f_{LO}$ and the polarity switching frequency $f_{POL}$ may be selected such that their sum corresponds to a center frequency of the second signal, and that their positive difference corresponds to a center frequency of the first signal. A bandwidth of the filter of such a mixer may then be selected in accordance with the bandwidth of that signal among the two signals that has the larger bandwidth, and it need not cover the entire range from a lower limit of the frequency range of the first signal to an upper limit of the frequency range of the second signal.

In accordance with further embodiments, the sum and the positive difference between the oscillator frequency $f_{LO}$ and the polarity switching frequency $f_{POL}$ may also be selected such that they deviate by a predefined range of the center frequency of one of the signals. For example, the oscillator frequency $f_{LO}$ and the polarity switching frequency $f_{POL}$ may be selected such that their sum deviates by a maximum of ±25%, ±10% or ±5% from the center frequency of the second signal and/or that their positive difference deviates by a maximum of ±25%, ±10% or ±5% from the center frequency of the first signal.

In accordance with some embodiments, the predefined oscillator frequency $f_{LO}$ may be selected to be different from the predefined polarity switching frequency $f_{POL}$.

In accordance with further embodiments, the oscillator frequency $f_{LO}$ may be selected to be a multiple or an integer multiple of the polarity switching frequency $f_{POL}$.

The input signal 101 may be an analog signal, for example a received and amplified antenna signal which is sampled directly with the aid of the mixer 100 without any additional downconversion. In other words, the architecture of the mixer 100 shown in FIG. 1 is characterized in that there is no analog downconversion prior to the sampling operation, this enables simple implementation of the polarity switching of the sampled input signal 103, for example using one single switch. Polarity switching, for example as a second mixing, has the advantage that it takes place in discrete time and that as a result, the requirements placed upon temporal accuracy become much more relaxed.

In accordance with further embodiments, the mixer 100 may be configured to switch the polarity of the sampled input signal 103 at points in time when an input of the mixer 105 at which the input signal 101 is received, and an output of the mixer 107 at which the sampled input signal 103 is provided are decoupled from each other.

One has found out that in a mixer, the output of the mixer 107 is not constantly coupled to the input of the mixer 105, for example in phases when a sampling switch of the mixer 100 is open. In the mixer 100, said phases may be utilized for switching the polarity of the sampled input signal 103. Switching of the polarity of the sampled input signal 103 when the output 107 is decoupled from the input 105 may achieve that a signal transmission behavior of the mixer 100 is not affected. This enables a quasi-digital second oscillator having very relaxed phase noise requirements.

In accordance with further embodiments, sampling of the input signal 105 at the oscillator frequency $f_{LO}$ by coupling and decoupling the output 107 from the input 105 of the mixer 100 may be effected at the oscillator frequency $f_{LO}$. In other words, the mixer 100 may be configured to couple, during sampling, the input of the mixer 105 to the output of the mixer 107 in a first state and to decouple the input of the mixer 105 from the output of the mixer 107 in a second state. For example, sampling of the input signal 105 may be realized with the aid of a sampling switch between the input 105 and the output 107, which sampling switch is opened and closed at the oscillator frequency $f_{LO}$. Therefore, the mixer 100 may be configured to switch between the first state and the second state at the oscillator frequency $f_{LO}$.

In addition, polarity switching of the sampled input signal 103 at the predefined polarity switching frequency $f_{POL}$ may be realized with a polarity switch. Iin a first state of the polarity switch, the polarity of the sampled input signal 103 is maintained as compared to the input signal 101, and in a second state of the polarity switch, the polarity of the sampled input signal 103 is reversed as compared to the input signal 101. Switching between the two states may be effected at the predefined polarity switching frequency $f_{POL}$. In particular, switching from the first state to the second state of the polarity switch may be effected when the sampling switch for sampling the input signal 101 is open (i.e. is in the second state in which the input 105 is decoupled from the output 107).

In accordance with the present application, a switch is open when a high-impedance connection exists between both its terminals, i.e. when a switchable path of the switch is in a high-impedance state. Moreover, a switch is closed when a low-impedance connection exists between both its terminals, i.e. when a switchable path of the switch is in a low-impedance state.

In other words, in accordance with some embodiments the mixer 100 may comprise a first switch (e.g. a sampling switch) for sampling the input signal 101 and a second switch (e.g. a polarity switch) for switching the polarity of the sampled input signal 103.

Figure 2A:
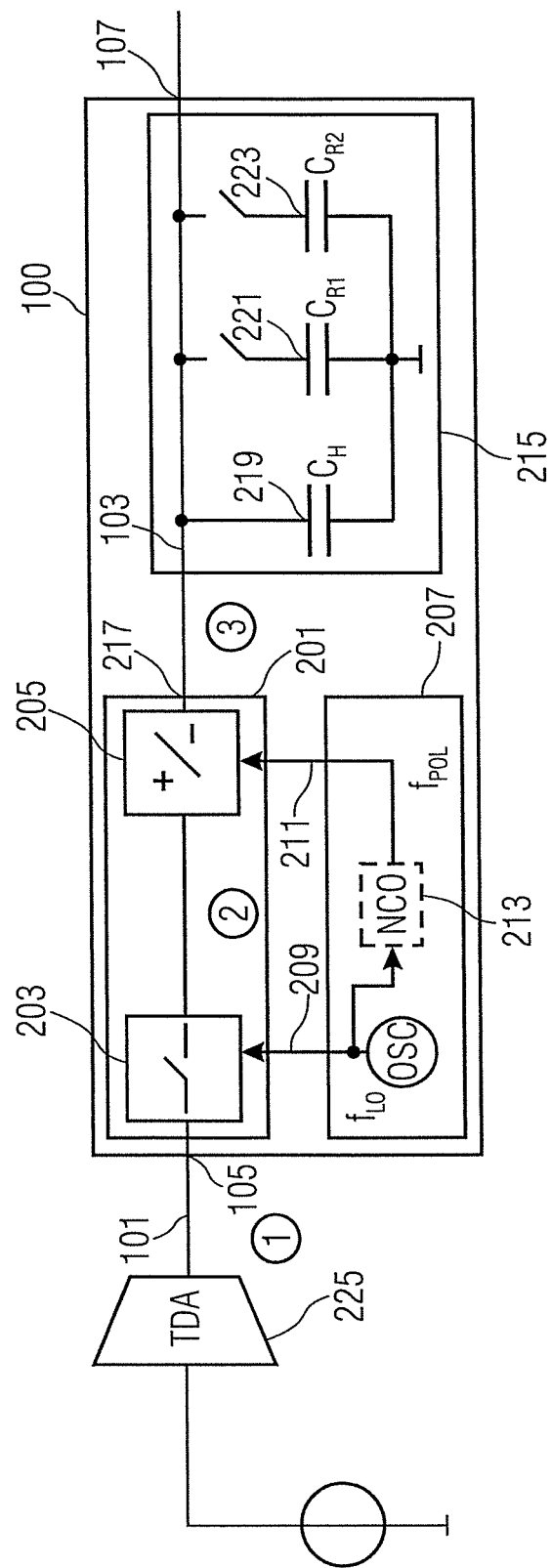
FIG. 2a shows a schematic representation of a possible implementation of the mixer shown in FIG. 1 in accordance with an embodiment.

In a block diagram, FIG. 2a shows a first possible implementation of the mixer 100 shown in FIG. 1. The implementation shown in FIG. 2a is characterized in that it comprises a mixer stage 201 having a first switch 203 (also referred to as a sampling switch) for sampling the input signal 101 at the oscillator frequency $f_{LO}$ as well as a second switch 205 (also referred to as a polarity switch or bipolar mixer) for switching the polarity of the sampled input signal at the polarity switching frequency $f_{POL}$. Therefore, the embodiment shown in FIG. 2a extends a so-called single down-conversion mixer by the additional polarity switch 205 after the sampling switch 203 (also referred to as a sampler).

In accordance with some embodiments, the polarity switching frequency $f_{POL}$ may be selected on the basis of the oscillator frequency $f_{LO}$ (for example in dependence on same). For example, the polarity switching frequency $f_{POL}$ may be generated with a so-called NCO (numerically controlled oscillator) 213 on the basis of the oscillator frequency $f_{LO}$. This enables that upon simultaneous reception of two signals of different bands in the input signal 101, the intermediate frequency for each band may be freely selected. In other words, if the polarity switch 205 is controlled using the NCO 213, the downconversion operation of the input signal 101 (and, thus, the overall LO signal for downconversion) will be effectively split up, which enables free selection of the intermediate frequency for each band.

As is shown in FIG. 2a, the mixer stage 201 is configured to receive the input signal 101 and to provide the sampled input signal 103. In addition, the mixer 100 may comprise an oscillator circuit 207 which is configured to provide to the mixer stage 201 an oscillator signal 209 having the oscillator frequency $f_{LO}$ and a polarity switching signal 211 having the polarity switching frequency $f_{POL}$. The mixer stage 201 provides the sampled input signal 103 on the basis of this oscillator signal 209 and the polarity switching signal 211. For example, the oscillator signal 209 may form a control signal for the sampling switch 203, and the polarity switching signal 211 may form a control signal for the polarity switch 205.

In accordance with further embodiments, a polarity of the oscillator signal 209 is kept constant, i.e. is not switched.

As was already described, the oscillator circuit 207 may be configured to provide the polarity switching signal 211 in dependence on the oscillator signal 209. For example, the oscillator circuit 207 may be configured to keep constant a phase relationship between the oscillator signal 209 and the polarity switching signal 211.

In accordance with further embodiments, the oscillator circuit 207 may be configured to provide the oscillator signal 209 and the polarity switching signal 211 in such a manner that a state change of the polarity switching signal 211 will occur only at such points in time when the oscillator signal 209 has a predefined state. In other words, the mixer 100 may be configured such that the polarity switch 205 changes its state only when the sampling switch 203 is in a predefined (constant) state. In this manner, one may achieve that a signal transmission characteristic of the mixer 100 is not corrupted by switching of the polarity switch 205.

For example, the mixer stage 207 may be configured to provide the polarity switching signal 211 and the oscillator signal 209 in such a manner that in the predefined state of the oscillator signal 209, during which a state change of the polarity switching signal 211 occurs, the input 105 of the mixer 100 is decoupled from the output 107 of the mixer 100. In other words, the mixer 100 may be configured such that a state change of the polarity switch 205 takes place only when the sampling switch 203 is open (i.e. when a switchable path of the sampling switch 203 is in a high-impedance state).

As already been mentioned, the oscillator circuit 207 may comprise a numerically controlled oscillator 213 to provide the polarity switching signal 211 based on the oscillator signal 209. For example, the oscillator circuit 207 may be configured to provide the polarity switching signal 211 and the oscillator signal 209 in such a manner that the oscillator frequency $f_{LO}$ is a multiple or an integer multiple of the polarity switching frequency $f_{POL}$.

Since in the mixer 100, as was already explained above, no analog downconversion takes place prior to the sampling operation, the oscillator signal 209 and the polarity switching signal 211 may be digital signals that may be created in a particularly simple manner (with a constant mutual phase relationship). The digital signals only serve as control signals for the switches 203, 205 with which the actual downconversion operation of the input signal 101 is performed.

In accordance with further embodiments, the oscillator circuit 207 may also comprise, instead of the numerically controlled oscillator 213, a different implementation for generating the polarity switching signal 211, for example while using an integer divisor.

In accordance with further embodiments, the mixer 100 may comprise a capacitance network 215, for example for holding the sampled input signal 103. The capacitance network 215 may be coupled to an output 217 of the mixer stage 201 at which the sampled input signal 103 is provided.

Furthermore, the capacitance network 215 may be coupled to the output 107 of the mixer 100.

The capacitance network 215 may comprise a capacitance 219 (also referred to as $C_H$) permanently coupled to the mixer stage 201. Due to the existence of the capacitance 219, which is permanently coupled to the mixer stage 201, the mixer 100 acts as an IIR (infinite impulse response) filter. The order of said filter is limited to one, as a result of which there is no freedom in designing filters with a given bandwidth. When using a single downconversion mixer for receiving two signals from two bands, the capacitance $C_H$ is selected such that the IIR filter allows an intermediate frequency between the bands of the two signals as well as the two signals themselves to pass. This typically results in a very large bandwidth of the IIR filter and, thus, to a poor filter performance (for example poor attenuation within the stop band). Embodiments circumvent this problem by additionally switching the polarity of the sampled input signal 103 at the polarity switching frequency $f_{POL}$, so that the intermediate frequency may be freely selected for each band and, thus, the bandwidth for the IIR filter formed by the capacitance $C_H$ may be selected to be clearly smaller, as a result of which the filter performance clearly improves (for example higher attenuation within the stop band). An example to further understanding of this principle will be given below with reference to FIG. 2c.

In addition, the capacitance network 215 may comprise a first capacitance 221 (also referred to as $C_{R1}$) switchably coupled to the mixer stage 201, and a second capacitance 223 (also referred to as $C_{R2}$) switchably coupled to the mixer stage 201. Those two switchable capacitances 221, 223 may be alternately switched, so that the charges on the capacitances and, thus, the input signal 103 may be read out, for example using a connected analog/digital converter of a subsequent stage.

In other words, the first switchable capacitance and the second switchable capacitance 223 may be connected to be complementary to each other, such that in a first phase, in which the first switchable capacitance 221 is coupled to the mixer stage 201, the second switchable capacitance 223 is decoupled from the mixer stage 201, and that in a second phase, in which the first switchable capacitance 221 is decoupled from the mixer stage 201, the second switchable capacitance 223 is coupled to the mixer stage 201.

In accordance with further embodiments, the mixer 100 may be configured such that switching of the first switchable capacitance 221 and of the second switchable capacitance 223 is effected only when the input 105 decouples from the output 107.

For example, switching of the capacitances 221, 223 may be effected when the sampling switch 203 is open and, thus, the input 105 of the mixer 100 is decoupled from the output 107 of the mixer 100. Due to the input signal 101 being sampled with the mixer stage 201, the capacitances of the capacitance network 215 are not permanently connected to the input 105 of the mixer 100, which results in points in time when the polarity switch 215 may be switched without affecting the signal transfer characteristics of the mixer 100. This enables a quasi-digital second oscillator having very relaxed phase noise requirements.

As is shown in FIG. 2a, the mixer 100 may be coupled to a transconductance amplifier (TDA) 225. Said transconductance amplifier 225 may convert an input voltage, e.g. received from an upstream amplifier (such as an LNA—Low Noise Amplifier) or from an antenna or from an antenna network, to a current for charging the capacitances of the capacitance network 215. Therefore, the input signal 101 may be a current signal.

In accordance with further embodiments, the mixer 100 may comprise a mixer stage in which the polarity switching of the sampled input signal 103 does not take place following sampling of the input signal 101, but concurrently therewith. Such a concept is schematically depicted in FIG. 2b.

In accordance with further embodiments, polarity switching may also be effected prior to sampling.

Figure 2B:
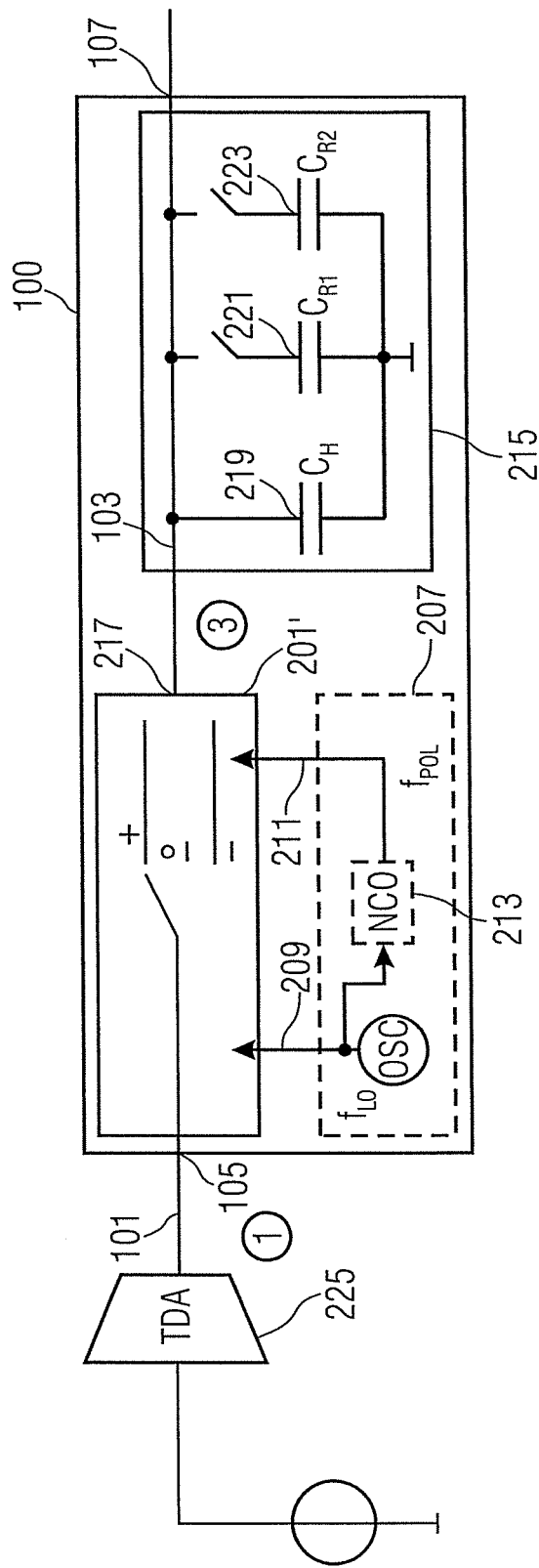
FIG. 2b shows a schematic representation of a further possible implementation of the mixer shown in FIG. 1 in accordance with a further embodiment.

The implementation, shown in FIG. 2b, of the mixer 100 differs from the implementation shown in FIG. 2a in that a mixer stage 201' of the embodiment shown in FIG. 2b does not switch the polarity of the input signal 101 following sampling of the input signal 101, but during sampling of the input signal 101. This is schematically depicted by means of the three possible switching states of the mixer stage 201'. A first switching state (represented by a +) signifies that the sampling switch of the mixer stage 201' is closed, i.e. that the input 105 of the mixer 100 is coupled to the output 107 of the mixer, and that the polarity of the sampled input signal 103 is maintained with regard to the input signal 101. A second switching state (represented by a zero) signifies that the sampling switch of the mixer stage 201' is open, i.e. that the input 105 is decoupled from the output 107. A third switching state of the mixer stage 201' (represented by a −) signifies that the input 105 is coupled to the output 107 and that the polarity of the sampled input signal 103 is reversed with regard to the input signal 101. The mixer stage 201 is configured to switch, in a first mode, between the first state and the second state at the oscillator frequency $f_{LO}$, and to switch, in a second mode, between the second state and the third state at the oscillator frequency $f_{LO}$. In addition, the mixer stage 201' is configured to switch between the first mode and the second mode at the polarity switching frequency $f_{POL}$.

Controlling the mixer stage 201' by means of the oscillator signal 209 and the polarity switching signal 211 may be effected analogously to controlling of the mixer state 201 of the embodiment shown in FIG. 2a. Therefore, the oscillator circuit 207 may be identical with the oscillator circuit 207 shown in FIG. 2a and may also have the optional functions mentioned additionally. The same applies to the capacitance network 215.

The functionality of the mixer 100 will be explained in more detail below with reference to FIG. 2c by using an example.

Figure 2C:
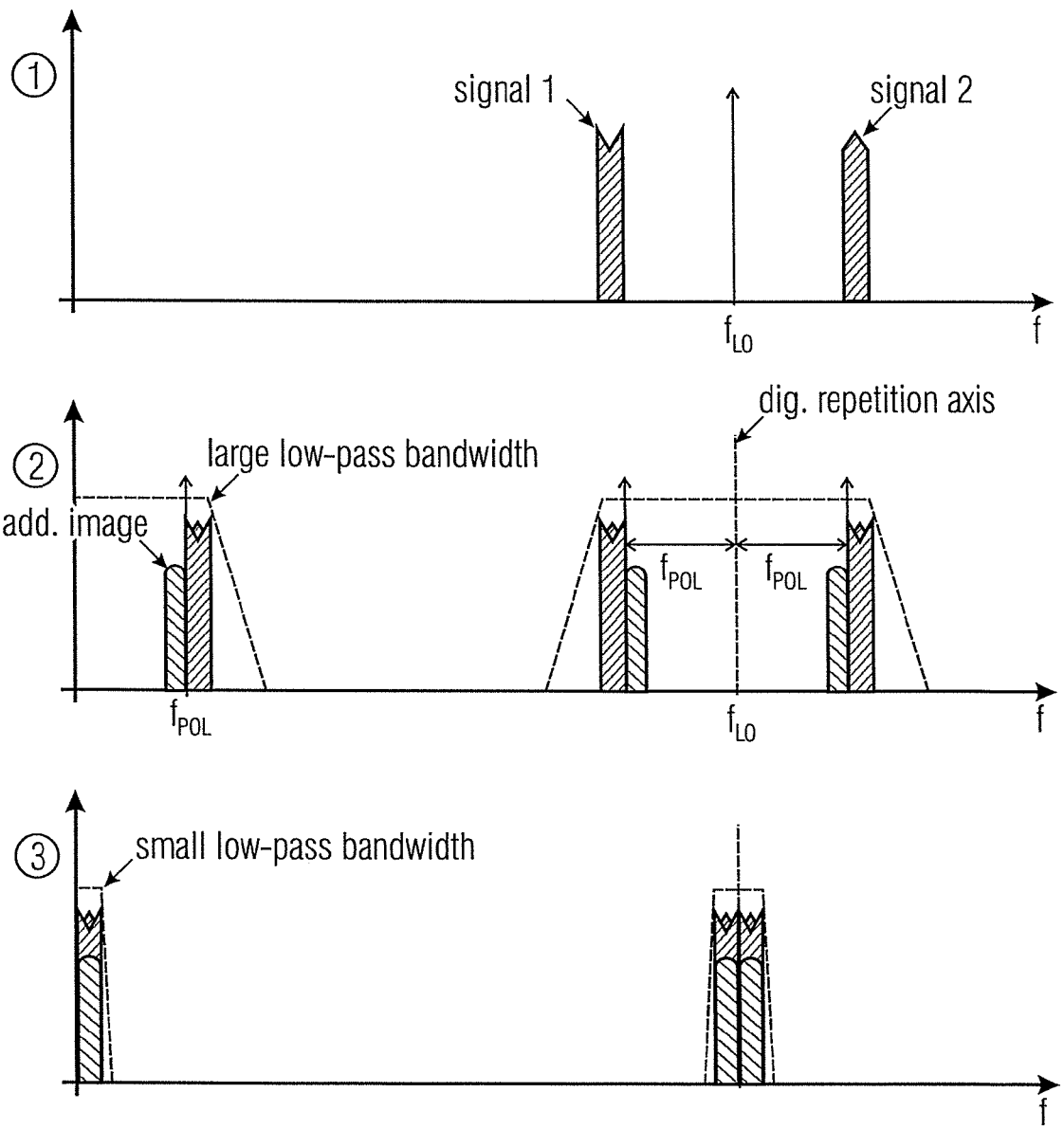
FIG. 2c shows three graphs for explaining the mixers shown in FIGS. 2a and 2b.

FIG. 2c shows two diagrams; a first diagram exemplifying an input signal 101 which includes two individual signals having different frequency bands. In a second diagram, the input signal is shown following sampling with the sampling switch 203 (this intermediate signal as is shown in the second diagram does not exist in this manner in the mixer stage 201' of the embodiment shown in FIG. 2b, since here, switching of the polarity takes place together with the sampling). A third diagram shows the frequency range of the sampled input signal 103 following polarity switching (e.g. at the output 217 of the mixer stages 201, 201').

In the example shown in FIG. 2c, two signals are to be received, as has already been mentioned. In this example, they are mixed to have the same intermediate frequency ($f_{POL}$). Therefore, no mirror band is shown for the first mixing process (from step 1 to step 2).

Following the first downconversion, both signals are at a comparatively high intermediate frequency, which leads to a high low-pass bandwidth. As was already mentioned, in a sampling receiver, a low-pass filter is that filter type for the early stages which is easiest to implement. Between step 2 and step 3, a further downconversion takes place so as to reduce the low-pass bandwidth. The second mixing process takes place in the region of the intermediate frequency ($f_{POL}$).

The second downconversion process therefore corresponds to the switching of the polarity of the sampled input signal. Due to the sampling, the signal is time-discrete as of the second diagram. Therefore, the spectrum is symmetrically mirrored and repeated (see digital repetition axis). Additionally, the second downconversion may produce an additional mirror band in the final signal band. It becomes clear from FIG. 2c that due to the double downconversion, the low-pass bandwidth for the mixer may be selected to be clearly smaller, which results in improved filter performance. As was already mentioned, this second downconversion is achieved by simply switching the polarity of the sampled input signal 103.

An example of simultaneous reception of two different bands will be shown below with reference to FIGS. 3a-3d.

In the near future, alternative global navigation satellite systems such as Galileo, Glonass and Compass will be available in addition to GPS (Global Positioning System). Moreover, new free civil signals will be transmitted. A second band in a satellite system receiver significantly improves the position detection accuracy since the additional band may be used for reducing or eliminating the ionospheric error (which is a main error in the calculation of positional data).

In a table, FIG. 3a shows various navigation system bands with their center frequencies and their bandwidths. For example, if the L1 and L5 bands are to be downconverted simultaneously, the mixed frequency might be selected to be 1386.165 MHz, for example. In this case, the bandwidth that may be used for the IIR filter would be at about 222 MHz, which results in an insufficient maximum attenuation of 7.5 dB.

Figure 3B:
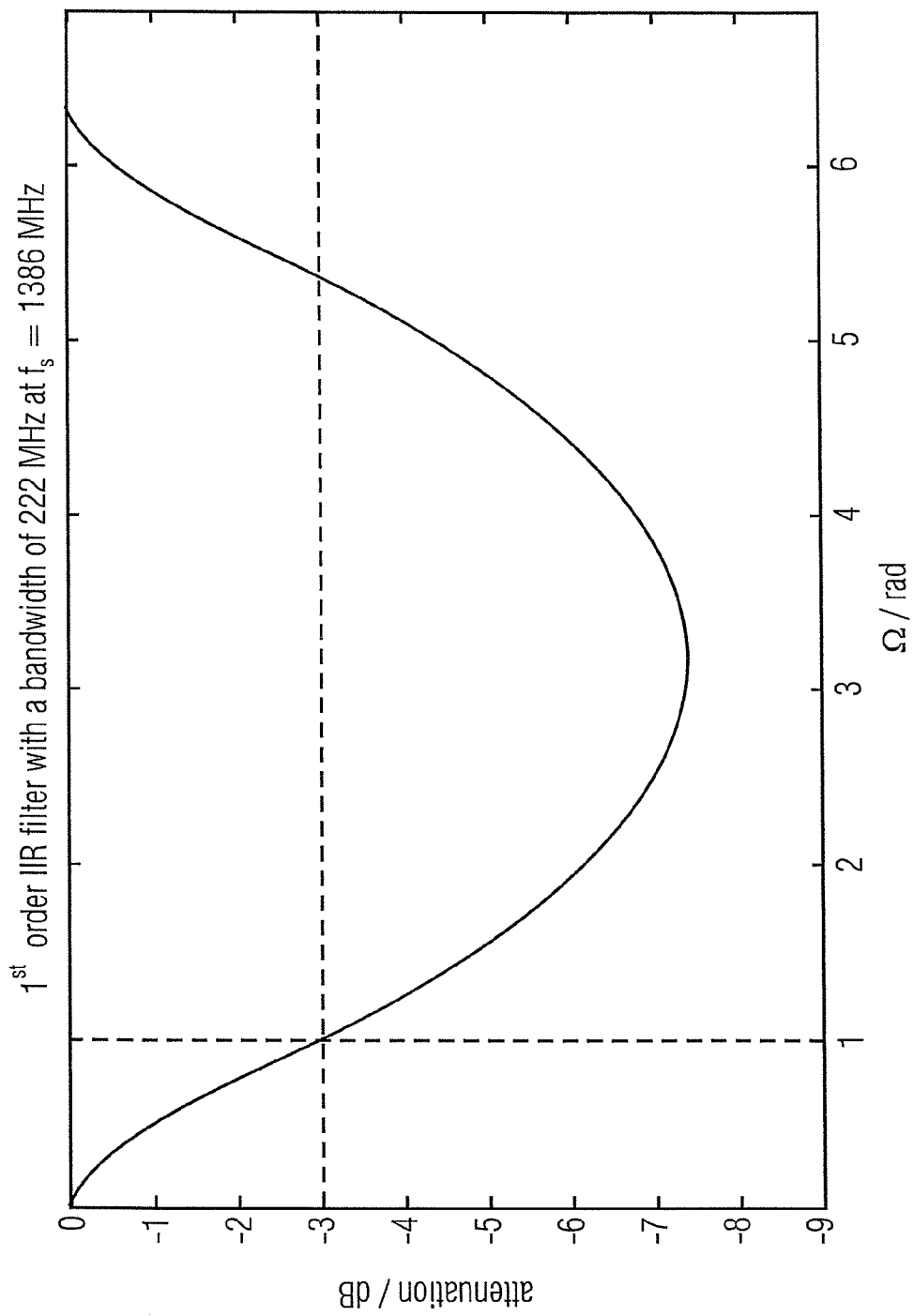
FIG. 3b shows a graph for representing a filter transmission function of a first-order IIR filter having a bandwidth of 222 MHz.

In this context, FIG. 3b shows a transmission function of such a first-order IIR filter having a bandwidth of 222 MHz.

Embodiments therefore perform a second downconversion operation at the polarity switching frequency $f_{POL}$ so as to split up the overall downconversion. This additional downconversion may result in that harmonics result, in particular at $f_{LO}+3 \cdot f_{POL}$. The oscillator frequency $f_{LO}$ and the polarity switching frequency $f_{POL}$ may therefore be selected, in accordance with embodiments, that due to the very low power of typical global navigation systems no strong interferer falls inband.

Figure 3C:
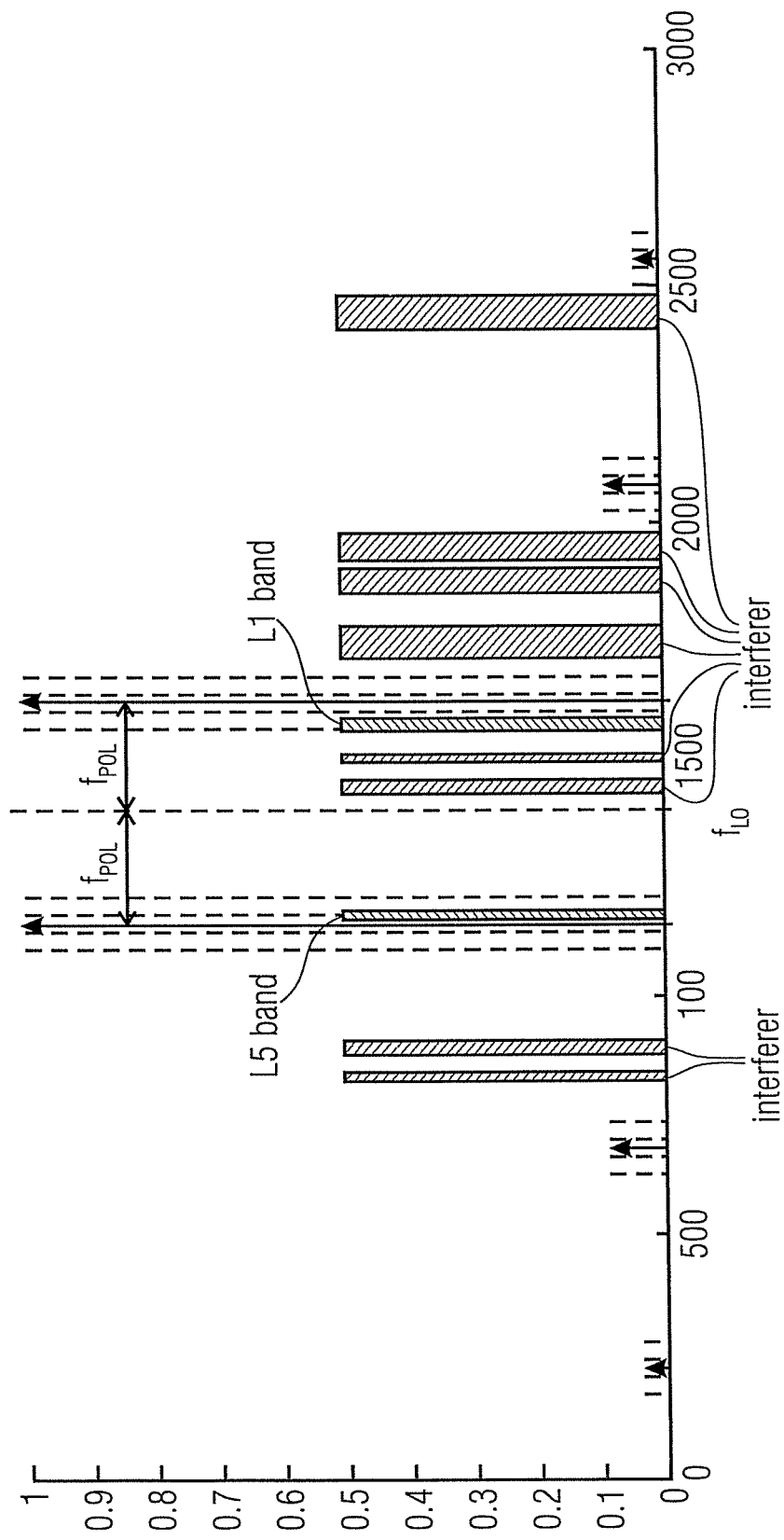
FIG. 3c shows a graph illustrating an exemplary frequency plan for simultaneously receiving two signals from two different bands.

FIG. 3c shows an acceptable frequency combination for receiving the L1 band and the L5 band, at an oscillator frequency of 1386.165 MHz and a polarity switching frequency of 231.028 MHz. It becomes clear from FIG. 3b that the frequency plan is selected such that no interferers fall inband, in other words, the oscillation frequency $f_{LO}$ and the polarity switching frequency $f_{POL}$ are selected such that there are no interferers within a given bandwidth around $f_{LO}+/-n \cdot f_{POL}$, n being an odd natural number.

In other words, a mixer in accordance with embodiments may be configured to receive a first data signal (e.g., an L5 data signal) having a first frequency range (e.g., 1166.22 MHz to 1186.68 MHz) and a first center frequency (e.g., 1176.45 MHz) and a second data signal (e.g., a Galileo L1 data signal) having a second frequency range (e.g., from 1559.05 MHz to 1591.79 MHz) and a second center frequency (e.g., 1575.42 MHz).

The first and second data signals are contained within the input signal of the mixer.

The second center frequency is higher than the first center frequency. A capacitance of the capacitance network of the mixer may be selected such that a pass bandwidth of a filter resulting from the capacitance (depicted by the dashed lines in FIG. 3c) for the sampled input signal is smaller than an amount of a difference between a lower limit of the first frequency range and an upper limit of the second frequency range. In other words, the filter bandwidth of the filter may be selected to be narrower than the bandwidth for the two signals to be received taken together.

In addition, the oscillator frequency $f_{LO}$ and the polarity switching frequency $f_{POL}$ may be selected such that the first frequency range lies within a predefined frequency range (defined by the filter bandwidth of the filter) around a positive difference between the oscillator frequency $f_{LO}$ and the polarity switching frequency $f_{POL}$ ($|f_{LO}-f_{POL}|$), and the second frequency range lies within a predefined frequency range (whose bandwidth is equal to the bandwidth of the predefined frequency range around the positive difference between the oscillator frequency $f_{LO}$ and the polarity switching frequency $f_{POL}$) around a sum of the oscillator frequency $f_{LO}$ and the polarity switching frequency $f_{POL}$ ($f_{LO}+f_{POL}$).

Figure 3D:
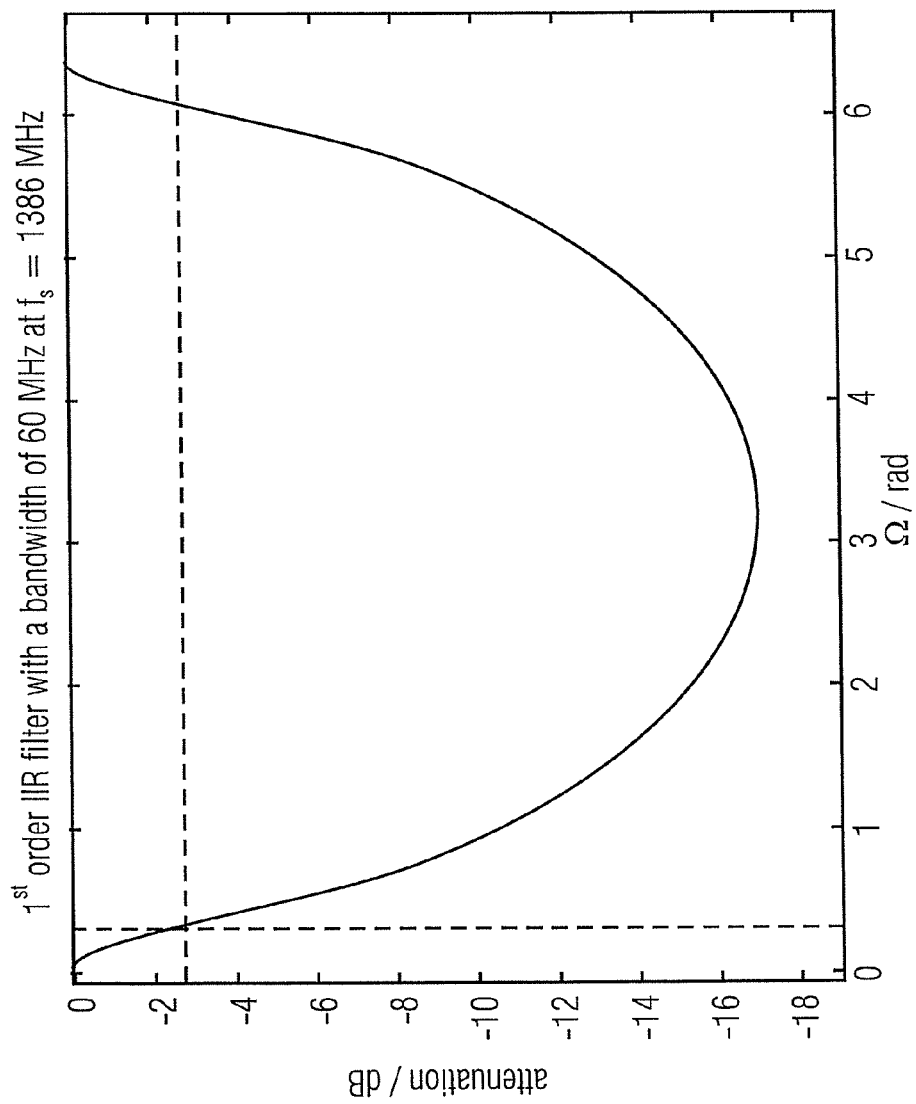
FIG. 3d shows a graph of a transmission function of a first-order IIR filter having a bandwidth of 60 MHz, as may be used in a mixer in accordance with an embodiment instead of the filter shown in FIG. 3b.

Due to the second downconversion due to the switching of the polarity of the sampled input signal 103, the bandwidth of the final signal in FIG. 3c is reduced to about 50 MHz. Accordingly, the filter of the mixer may also have a smaller bandwidth of 60 MHz; this entails an advantage for the IIR attenuation of 10 dB, as is shown in FIG. 3d.

To enable polarity switching in embodiments, an already existing sampling mixer may be modified only marginally. For example, in order to enable such a bipolar mixing operation, differential output nodes of the sampling mixer may be inverted at the polarity switching frequency. The inversion may be effected directly within the switching quad.

Figure 4A:
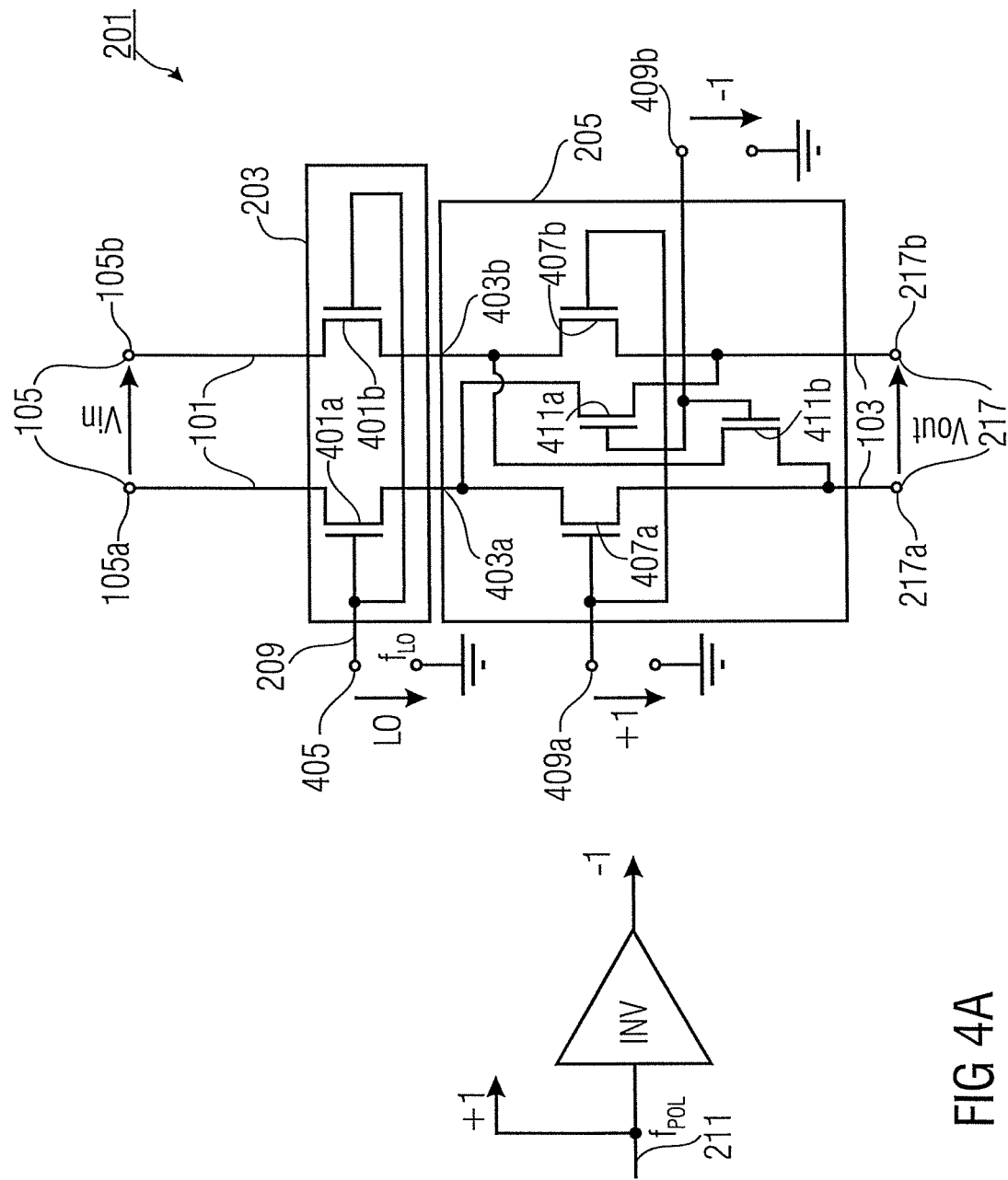

FIG. 4a shows a possible realization, in terms of circuitry, of the mixer stage 201 shown in FIG. 2a, wherein sampling of the input signal 101 and switching of the polarity of the sampled input signal 103 are performed sequentially (i.e. one after the other).

The implementation, in terms of circuitry, shown in FIG. 4a, of the mixer stage 201 is configured to receive the input signal 101 as a differential input signal, which enables simply switching the polarity of the input signal 101 by exchanging the differential nodes (using the polarity switch 205).

The sampling switch 203 may comprise a first sampling transistor 401a and a second sampling transistor 401b. A switchable path of the first sampling transistor 401a may be connected between a first input node 105a of the mixer stage 201 and a first input node 403a of the polarity switch 205. A switchable path of the second sampling transistor 401b may be connected between a second input node 105b of the mixer stage 201 and an input node 403b of the polarity switch 205. Control terminals of the two sampling transistors 401a, 401b may be coupled to an oscillator signal input 405 of the mixer stage 201 at which the oscillator signal 209 is provided.

Therefore, the two sampling transistors 401a, 401b may be controlled such that they will simultaneously set their switchable paths in a low-resistance state or a high-resistance state so as to perform sampling of the differential input signal 101.

The polarity switch 205 may comprise a first non-inverting transistor 407a and a second non-inverting transistor 407b. A switchable path of the first non-inverting transistor 407a is coupled between the first input node 403a of the polarity switch 205 and a first output node 217 of the mixer stage 201. A switchable path of the second non-inverting transistor 407b is coupled between the second input node 403b of the polarity switch 205 and a second output node 217b of the mixer stage 201. Control inputs of the two non-inverting transistors 407a, 407b may be coupled to a first polarity switching signal input 409a of the polarity switch 205 (and the mixer stage 201) at which, e.g. the polarity switching signal 211 is provided in a non-inverting version. The non-inverting transistors 407a and 407b are wired such that in their low-resistance state they allow the input signal 101 to pass through the polarity switch 205 without reversing the polarity of the sampled input signal 103 with regard to the input signal 101.

In addition, the polarity switch 205 may comprise a first inverting transistor 411a and a second inverting transistor 411b. A switchable path of the first inverting transistor 411a may be connected between the first input node 403a of the polarity switch 205 and the second output node 217b of the mixer stage 201. A switchable path of the second inverting transistor 411b may be connected between the second input node 403b of the polarity switch 205 and the first output node 217a of the mixer stage 201. Control terminals of the two inverting transistors 411a, 411b may be coupled to a second polarity switching signal input 409b of the polarity switch 205 (and the mixer stage 201) at which the polarity switching signal 211 is present, e.g., in an inverted version. Both inverting transistors 411a, 411b are wired such that in the low-resistance state of their switchable paths, they will reverse the polarity of the sampled input signal 103 with regard to the input signal 101.

As is evident from FIG. 4a, the non-inverting transistors 407a, 407b are controlled in a manner that is inverted in relation to the inverting transistors 411a, 411b, so that in a first state of the polarity switch 205, the non-inverting transistors 407a, 407b are in their conducting state, and the inverting transistors 411a, 411b are in their non-conducting state. In this first state of the polarity switch 205, the polarity of the sampled input signal 103 is therefore maintained with regard to the input signal 101. In a second state of the polarity switch 205, the non-inverting transistors 407a, 407b are in their non-conducting state, and the inverting transistors 411a, 411b are in their conducting state, so that in this second state, the polarity of the sampled input signal 103 is reversed with regard to the input signal 101.

Switching of this state of the polarity switch 205 may take place when the sampling transistors 401a, 401b are in their non-conducting state, i.e. when the input 105 of the mixer stage 201 is decoupled from the output 217 of the mixer 201.

As is evident from FIG. 4a, the inverted version of the polarity switching signal 211 may simply be generated with the help of an inverter. In accordance with further embodiments, the oscillator circuit 207, too, may provide the polarity switching signal 211 already in inverted and non-inverted versions for the mixer stage 201.

In summary, FIG. 4a shows a mixer stage 201 for a mixer in accordance with an embodiment, which mixer stage 201 comprises the sampling stage 203 which is configured to sample the received input signal 105 at the predefined oscillator frequency $f_{LO}$ so as to obtain the sampled input signal 103. In addition, the mixer stage 201 comprises the polarity switch 205 configured to switch the polarity of the sampled input signal 103 at the predefined polarity switching frequency $f_{POL}$.

Figure 4B:
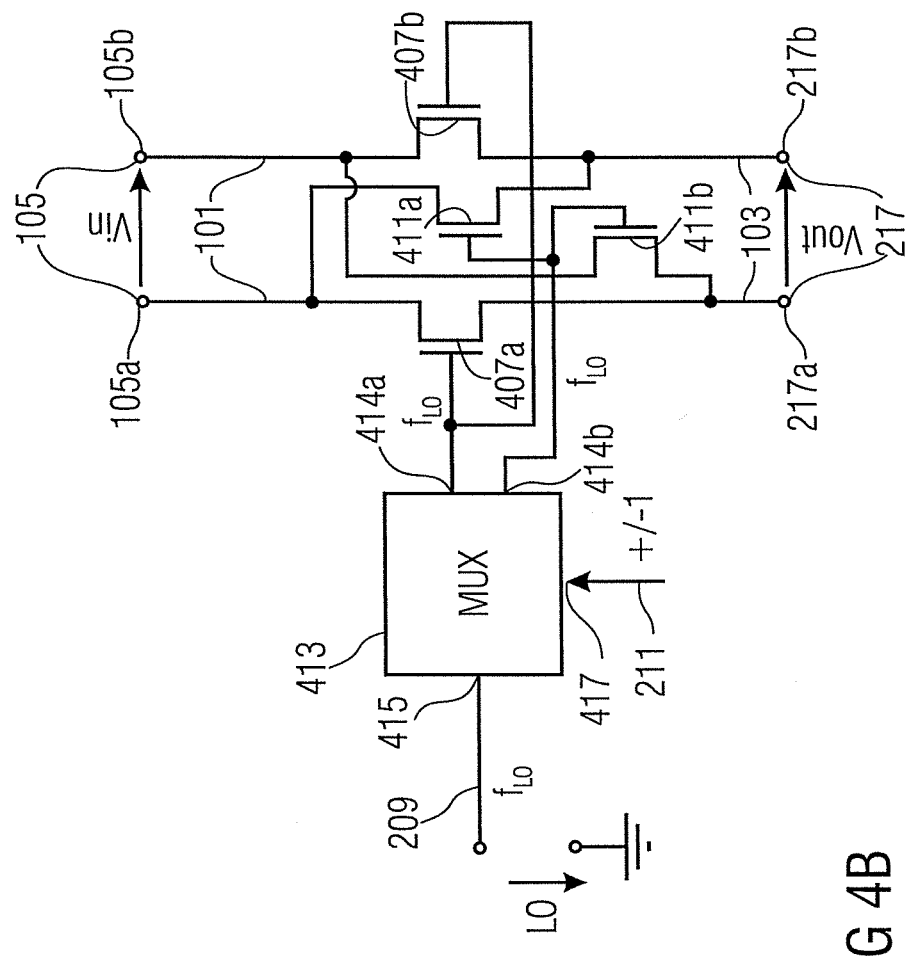
FIG. 4b shows an equivalent circuit diagram of a possible realization, in terms of circuitry, of the mixer shown in FIG. 2b.

FIG. 4b shows a possible realization, in terms of circuitry, of the mixer stage 201' of the embodiment shown in FIG. 2b. The mixer stage 201' shown in FIG. 4b differs from the mixer stage 201 shown in FIG. 4a in that sampling of the input signal 101 is not effected separately from the polarity switching of the sampled input signal 103, but that sampling is already based on the oscillator signal 209 and the polarity switching signal 211. To this end, the mixer stage 201' comprises—comparably to the mixer state 201—a first non-inverting transistor 407a and a second non-inverting transistor 407b. A switchable path of the first non-inverting transistor 407a is connected between a first input node 105a of the mixer stage 201' and a first output node 217a of the mixer stage 201'. A switchable path of the second non-inverting transistor 407b is connected between a second input node 105b of the mixer stage 201' and a second output node 217b of the mixer stage 201'.

In addition, the mixer stage 201' comprises, by analogy with the mixer stage 201, a first inverting transistor 411a and a second inverting transistor 411b.

A switchable path of the first inverting transistor 411a is connected between the first input node 105a of the mixer stage 201' and the second output node 217b of the mixer stage 201'. A switchable path of the second inverting transistor 411b is connected between the second input node 105b of the mixer stage 201' and the first output node 217a of the mixer stage 201'.

Wiring of the transistors 407a, 407b, 411a and 411b in the mixer stage 201' is therefore analogous to the connection wiring of the transistors 407a, 407b, 411a, 411b in the mixer stage 201. Switching of the polarity of the sampled input signal 103 is therefore effected in the mixer stage 201' in a manner analogous to the mixer stage 201.

Moreover, the mixer stage 201' comprises a switching signal provider 413 configured to alternately provide the oscillator signal having the predefined polarity switching frequency $f_{POL}$ at control inputs of the non-inverting transistors 407a, 407b and at control inputs of the inverting transistors 411a, 411b. To this end, the control inputs of the non-inverting transistors 407a, 407b may be coupled to a first output 414a of the switching signal provider 413, and the control inputs of the inverting transistors 411a, 411b may be coupled to a second output 414b of the switching signal provider 413.

The switching signal provider 413 may be a multiplexer 413, for example, which receives the oscillator signal 209 at a data input 415 and receives the polarity switching signal 211 at a selection input 417. Therefore, the multiplexer 413 may, in dependence on a state of the polarity switching signal 211, provide the oscillator signal 415 either at its first output 414a and, thus, at the control inputs of the non-inverting transistors 407a, 407b, or at its second output 414b and, thus, at the control inputs of the inverting transistors 411a, 411b.

Therefore, unlike the embodiment shown in FIG. 4a, a signal having the oscillator frequency $f_{LO}$ rather than a signal having the polarity switching frequency $f_{POL}$ will be present at the control inputs of the transistors 407a, 407b, 411a, 411b.

Therefore, sampling of the input signal 101 is effected directly by using the transistors 407a, 407b, 411a, 411b. Thus, the transistors 407a, 407b, 411a, 411b may be referred to, in summary, as a sampling stage of the mixer stage 201', which is configured to sample the received input signal 105 at the predefined oscillator frequency $f_{LO}$ of the applied oscillator signal 209 and to maintain, during sampling, the polarity of the sampled input signal 103 with regard to the received input signal 101 when the oscillator signal 209 is present at a first oscillator signal input of the sampling stage (and, thus, at the control inputs of the non-inverting transistors 407a, 407b), and to switch, during sampling, the polarity of the sampled input signal 103 with regard to the received input signal 105 when the oscillator signal 209 is present at a second oscillator signal input of the sampling stage (and, thus, at the control terminals of the inverting transistors 411a, 411b).

The switching signal provider 413 is configured to alternately apply the oscillator signal 209 having the predefined polarity switching frequency of $f_{POL}$ at the first oscillator signal input of the sampling stage and the second oscillator signal input of the sampling stage.

The mixer circuit shown in FIG. 4b has the advantage over the mixer circuit shown in FIG. 4a that only one transistor is located in the signal path for the input signal 101, whereas in the implementation shown in FIG. 4a, two transistors (one transistor of the sampling stage 203 and one transistor of the polarity switch 205) are located in the signal path. If in FIG. 4a, the effective path resistance is to be kept constant as compared to the case without polarity mixing, the surface area required may increase. In addition, parasitic capacitances increase. By means of the implementation shown in FIG. 4b, this problem, which may possible arise, may be circumvented.

The implementation shown in FIG. 4a has the advantage over the implementation shown in FIG. 4b that in the LO path (for the oscillator signal 209) no additional circuit is present that would increase phase noise.

Since the duty cycle of the sampled input signal 103 following the mixer stage (or the mixer) is only 50%, the off time may be used for synchronizing the second clock signal (the polarity switching signal) to the oscillator signal 209). This enables utilization of a quasi-digital circuit for this second clock (e.g. while using an integer division of the LO signal and/or of the oscillator signal 209 or of a numerically controlled oscillator).

In many cases of application it may be advantageous to perform mirror frequency suppression (image rejection) and separation of several bands contained within the input signal 101. In this case, a mixer system in accordance with a further embodiment, as is shown in FIG. 5a, may be used.

Figure 5A:
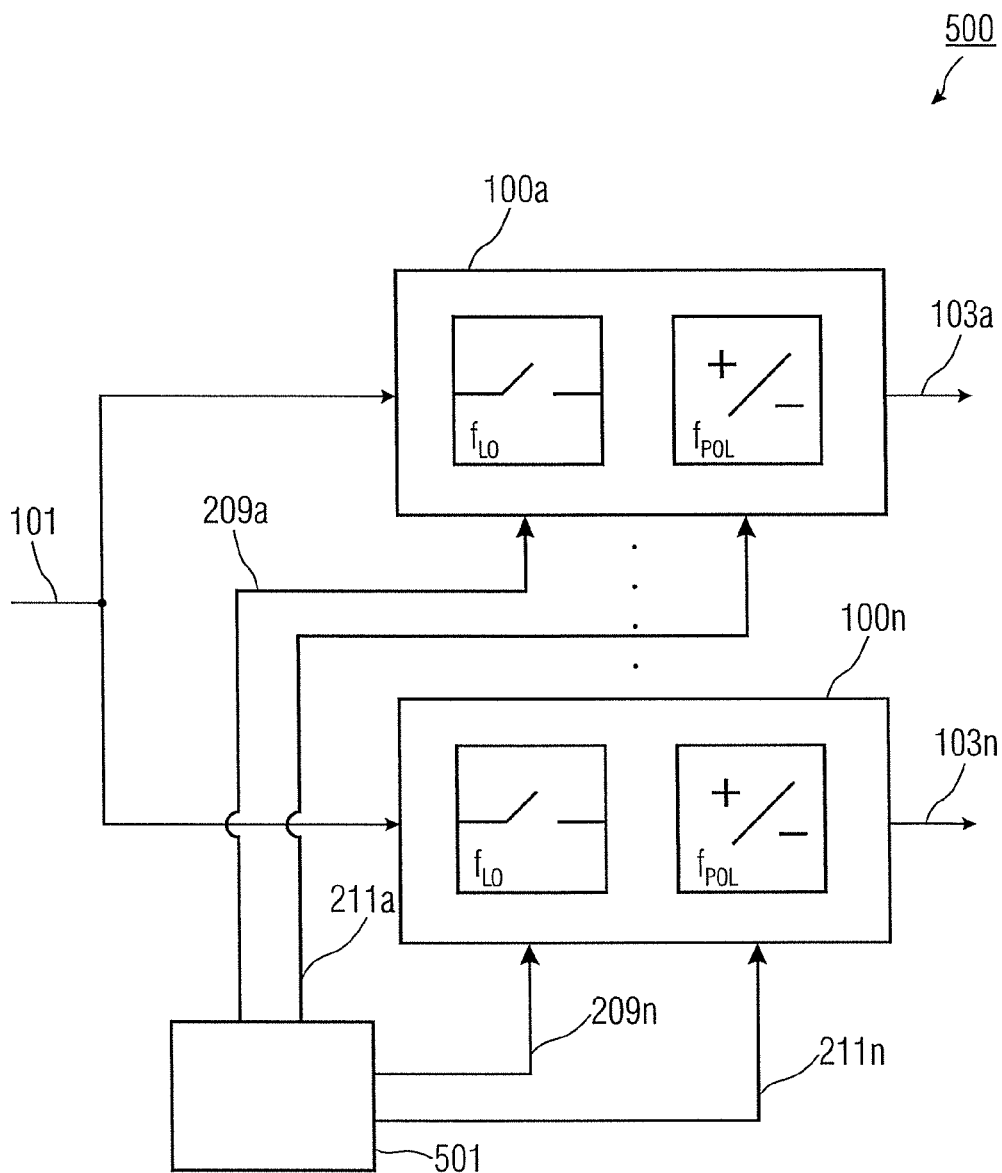
FIG. 5a shows a block diagram of a mixer system in accordance with a further embodiment.

To this end, FIG. 5a shows the mixer system 500 comprising a plurality of mixers 100a to 100n, n being any natural number (e.g. 4). Each of the mixers 100a to 100n is configured to sample a received input signal 101 at a predefined oscillator frequency $f_{LO}$ and to switch a polarity of the sampled input signal 103a to 103n at a predefined polarity switching frequency $f_{PLO}$.

In addition, the mixer system 500 comprises a clock provision means 501 configured to provide an oscillator signal 209a to 209n having a predefined oscillator frequency $f_{LO}$ and a polarity switching signal 211a to 211n having a predefined polarity switching frequency $f_{POL}$ to each mixer among the plurality of mixers 100a to 100n.

In addition, the clock provision means 501 is configured to provide the oscillator signals 209a to 209n such that oscillator signals for different mixers among the plurality of mixers 100a to 100n are shifted in phase in relation to one another. In addition, the clock provision means 501 is configured to provide polarity switching signals for different mixers among the plurality of mixers 100a to 100n such that they are shifted in phase in relation to one another.

By means of said phase-shifted provision of the oscillator signals 209a to 209n and of the polarity switching signals 211a to 211n for the mixers 100a to 100n, both mirror frequency suppression and separation of different bands contained within the input signal 101 may be achieved by combining the sampled input signals 103a to 103n of the different mixers 100a to 100n.

The clock provision means 501 may provide the oscillator signals 209a to 209n such that all of them comprise the same predefined oscillator frequency $f_{LO}$. In addition, the clock provision means 501 may provide the polarity switching signals 211a to 211n such that all of them have the same polarity switching frequency $f_{POL}$. Since in the mixer system 500, no analog downmixing takes place prior to sampling, and since the oscillator signals 209a to 209n as well as the polarity switching signals 211a to 211n may be provided as digital signals, the signals may be realized with a high level of accuracy (for example with a constant mutual phase relationship), whereby mirror frequency suppression may be achieved with a high level of quality.

In accordance with further embodiments, the clock provision means 501 may be configured to provide each mixer 100a to 100n with its oscillator signal 209a to 209n and its polarity switching signal 211a to 211n such that a state change of a polarity switching signal of a mixer will occur only when the oscillator signal of the mixer has a predefined state in which an output of the mixer at which the mixer provides its sampled input signal is decoupled from an input of the mixer at which the mixer receives the input signal. For example, the clock provision means 501 may be configured to allow a state change of a polarity switching signal of one of the mixers only when its associated oscillator signal has a predefined state in which the input of the mixer is decoupled from the output of the mixer, so that a signal transmission characteristic of the mixer is not corrupted by the polarity switching of the mixer.

The mixers 100a to 100n may be identical with the mixer 100 in accordance with FIG. 1, for example, and they may also have the additional optional properties and/or extensions that were described in connection with FIGS. 2a to 4b.

Figure 5B:
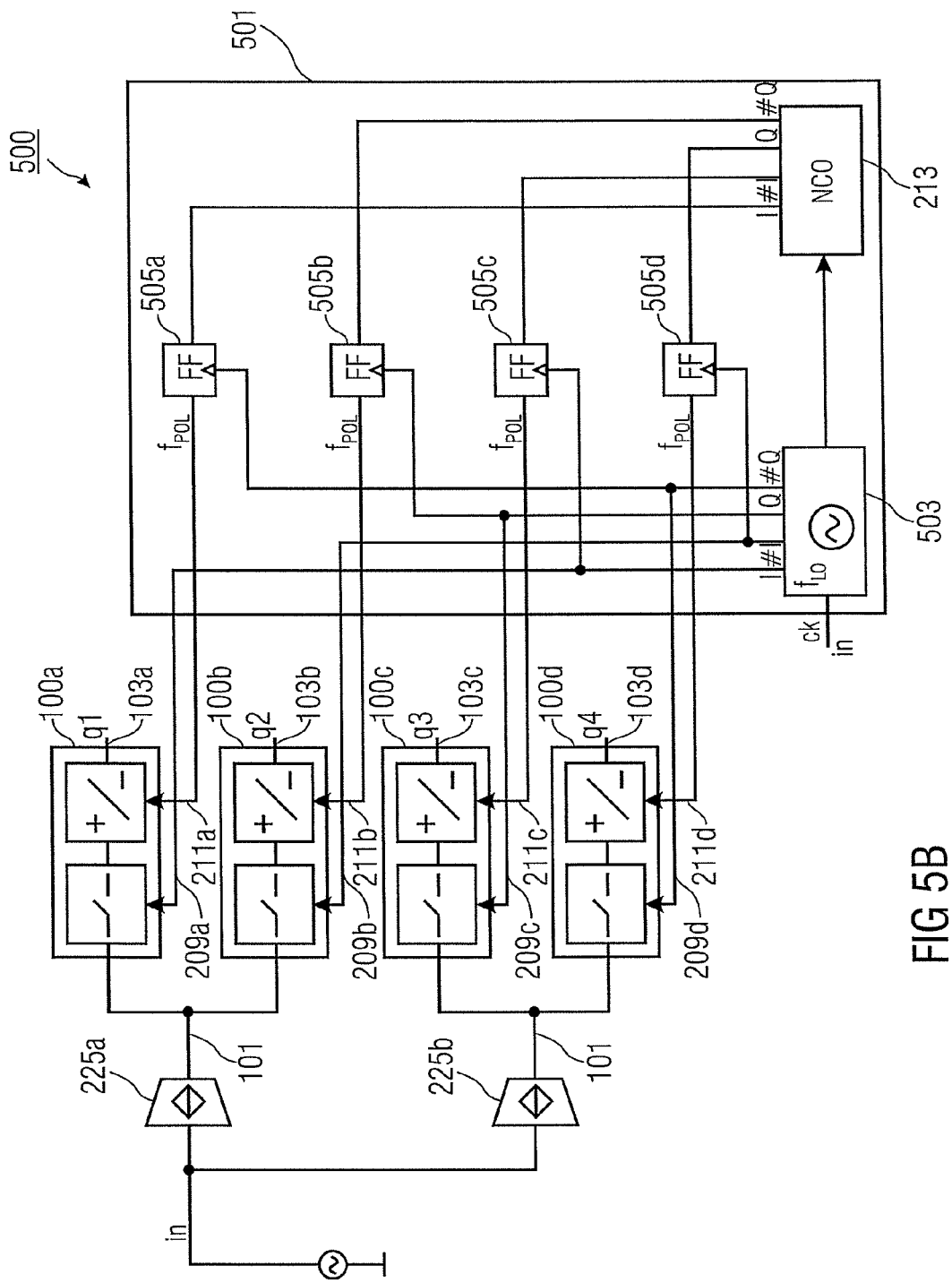

FIG. 5b shows a possible implementation of the mixer system 500 for mirror frequency suppression, n being selected to be equal to 4. It is only symbolic that the mixers 100a to 100d of the mixer system 500 have the sampling stage 201. In accordance with further embodiments, the mixers 100a to 100d may also comprise the sampling stage 201' since the functionality of the sampling stages is the same, and since only internal implementations differ.

For the double downconversion performed in the mixers 100a to 100d, each phase of each mixer is combined with each other phase for mirror frequency suppression, which results in a total of four paths, that is four different sampled input signals 103a to 103d (also referred to as q1 to q4). To this end, the clock provision means 501 provides the various oscillator signals 209a to 209d as well as the various polarity switching signals 211a to 211d. In a non-sampling structure (e.g. with analog downconversion) this would be difficult if not impossible to achieve since it is advantageous for the phases to match very well.

However, in embodiments, the second mixer (e.g. the polarity switch 205) is quasi-digital due to the times when the mixer output is decoupled from the mixer input. Therefore, the additional phases that may be used for the second downconversion (for polarity switching) may be generated in a simple manner, as is shown in the clock generation example shown in FIG. 5b.

To this end, the clock provision means 501 comprises an oscillator 503 for providing the various oscillator signals 209a to 209d sharing the oscillator frequency $f_{LO}$. In addition, the clock provision means 501 comprises a numerically controlled oscillator 213 as well as flipflops 505a to 505d for providing the polarity switching signals 211a to 211d having the polarity switching frequency $f_{POL}$. Due to utilization of the numerically controlled oscillator 213, the phases of the polarity switching signals 211a to 211d may be generated with very high precision. In addition, the polarity switching signals 211a to 211d may be provided such that the oscillator frequency $f_{LO}$ is a multiple of the polarity switching frequency $f_{POL}$. The flipflops 505a to 505d, which are connected between the numerically controlled oscillator 213 and the polarity switching signal inputs of the mixers 100a to 100d serve to ensure that a state change of a polarity switching signal 211a to 211d of one of the mixers 100a to 100d will occur only when the associated oscillator signal 209a to 209d of the mixer 100a to 100d is in a predefined state in which the input of the mixer 100a to 100d is decoupled from the output of the mixer 100a to 100d.

Therefore, the flipflops 505a to 505d may be clock pulse edge-triggered flipflops (for example onto a rising clock pulse edge). For example, a control signal for a first flipflop 505a for providing a first polarity switching signal 211a for a first mixer 100a may be provided such that said control signal is shifted in phase in relation to a first oscillator signal 209a of the first mixer 100a and further has a rising edge when the oscillator signal 209a has a state (e.g. a zero level) for which the input of the first mixer 100a is separate from the output of the first mixer 100a.

By analogy, this applies to the control signals of the flipflops 505b to 505d.

In addition, the first oscillator signal 209a and the second oscillator signal 209b may be mutually complementary, so that alternately, either the input and the output of the first mixer 100a are coupled to each other, or the input and the output of the second mixer 100b are coupled to each other. By analogy, one may also select the oscillator signals 209a, 209d for a third mixer 100c and a fourth mixer 100d. A third oscillator signal 209c for controlling the third mixer 100c may be selected to be shifted in phase (e.g. shifted in phase by 90°) in relation to the first oscillator signal 209a. A fourth oscillator signal 209d for the fourth mixer 100d may be selected to be shifted in phase (e.g. shifted in phase by 90°) in relation to the second oscillator signal 209b for the second mixer 100b.

As is shown in FIG. 5b, the mixer system 500 may further comprise a first transconductance amplifier 225a for providing the input signal 101 for the mixers 100a, 100b, and a second transimpedance amplifier 225b for providing the input signal 101 for the mixers 100c, 100d.

In one application of the mixer system 500, the transimpedance amplifiers 225a and 225b may be coupled or connected, e.g., to an upstream stage or an antenna or an antenna circuit.

The four sampled input signals 103a to 103d that have been generated may be merged for mirror frequency suppression and for separating the two bands that are present in the input signal 101.

The oscillator 503 may be a so-called voltage-controlled oscillator (VCO), for example. Such an oscillator typically is already present in the system so as to generate the LO signal (the oscillator signal 109).

Figure 5C:
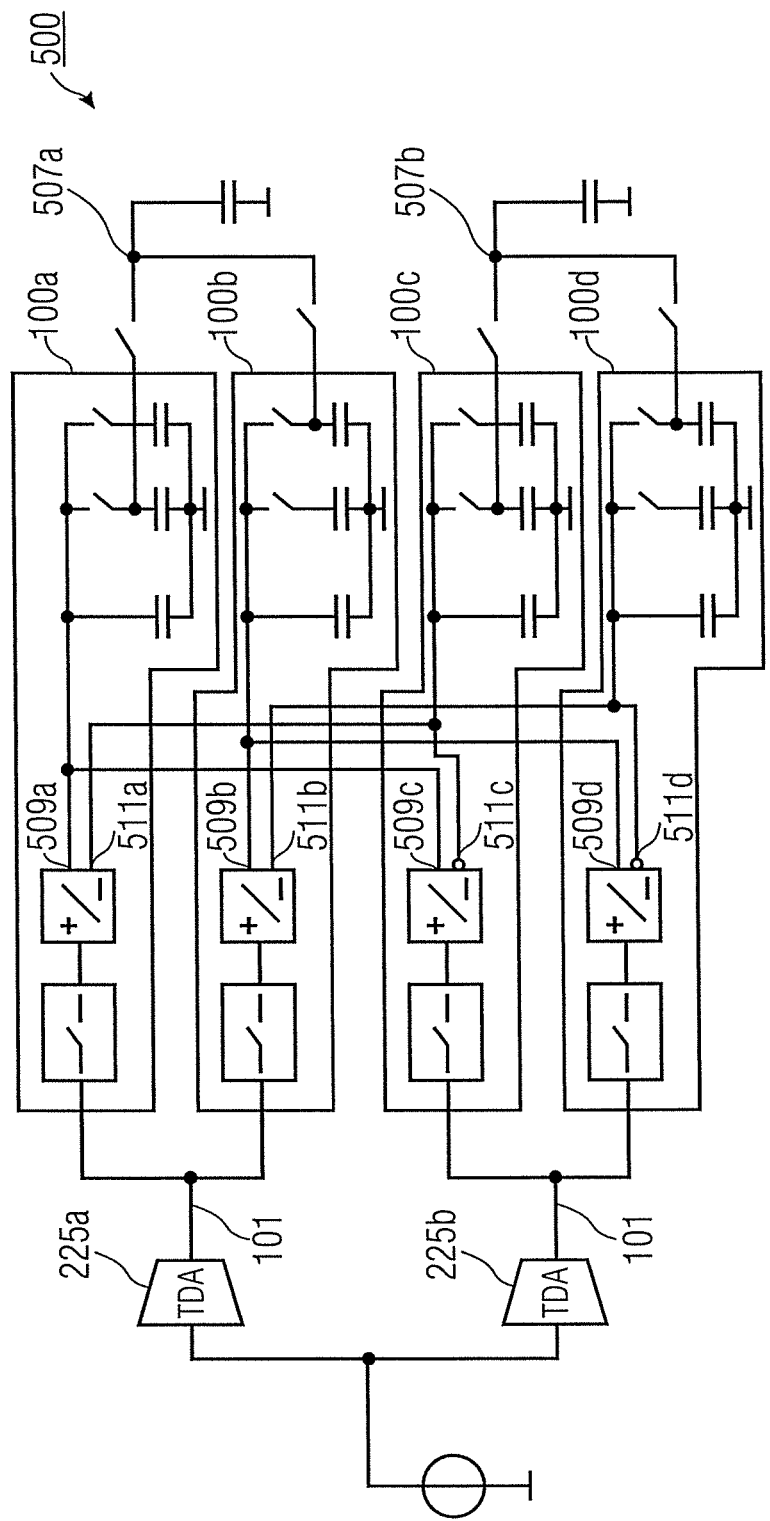
FIG. 5c shows a possible wiring of individual mixers of the mixer system shown in FIG. 5b to achieve mirror frequency suppression and band separation.

FIG. 5c shows a possible wiring of the mixers 100a to 100d of the mixer system 500 for mirror frequency suppression and band separation. For clarity's sake, the clock provision means 501 is not depicted. In addition to FIG. 5b, capacitance networks of the mixers 100a to 100d are also depicted. The wiring of the mixers 100a to 100d which is shown in FIG. 5c enables the first signal present in the input signal 101 to be able to be tapped at a first output node 507a of the mixer system 500, whereas the second signal that is present in the input signal 101 may be tapped at a second output node 507b of the mixer system 500.

To achieve this functionality, a first non-inverting output 509a of the mixer stage of the first mixer 100a is coupled to the capacitance network thereof and to a non-inverting output 509c of the third mixer 100c.

A second non-inverting output 511a of the mixer stage of the first mixer 100a is coupled to an inverting output 511c of the third mixer 100c and its capacitance network.

A first non-inverting output 509b of the mixer stage of the second mixer 100b is coupled to the capacitance network of same and to a non-inverting output 509d of the mixer stage of the fourth mixer 100d.

A second non-inverting output 511b of the mixer stage of the second mixer 100b is coupled to an inverting output 511d of the mixer stage of the fourth mixer 100c and its capacitance network.

At an inverting output of a mixer stage, the sampled input signal is present in such a manner that it is inverted in relation to the inverted output.

The capacitance networks of the first mixer 100a and of the second mixer 100b are switchably coupled to the first output node 507a of the mixer system 500.

The capacitance networks of the third mixer 100c and of the fourth mixer 100d are switchably coupled to the second output node 507b of the mixer system 500.

Therefore, the mixer system 500 enables image rejection by means of addition and subtraction.

One main advantage of the system shown in FIG. 5c is its ease of implementation.

Figure 6A:
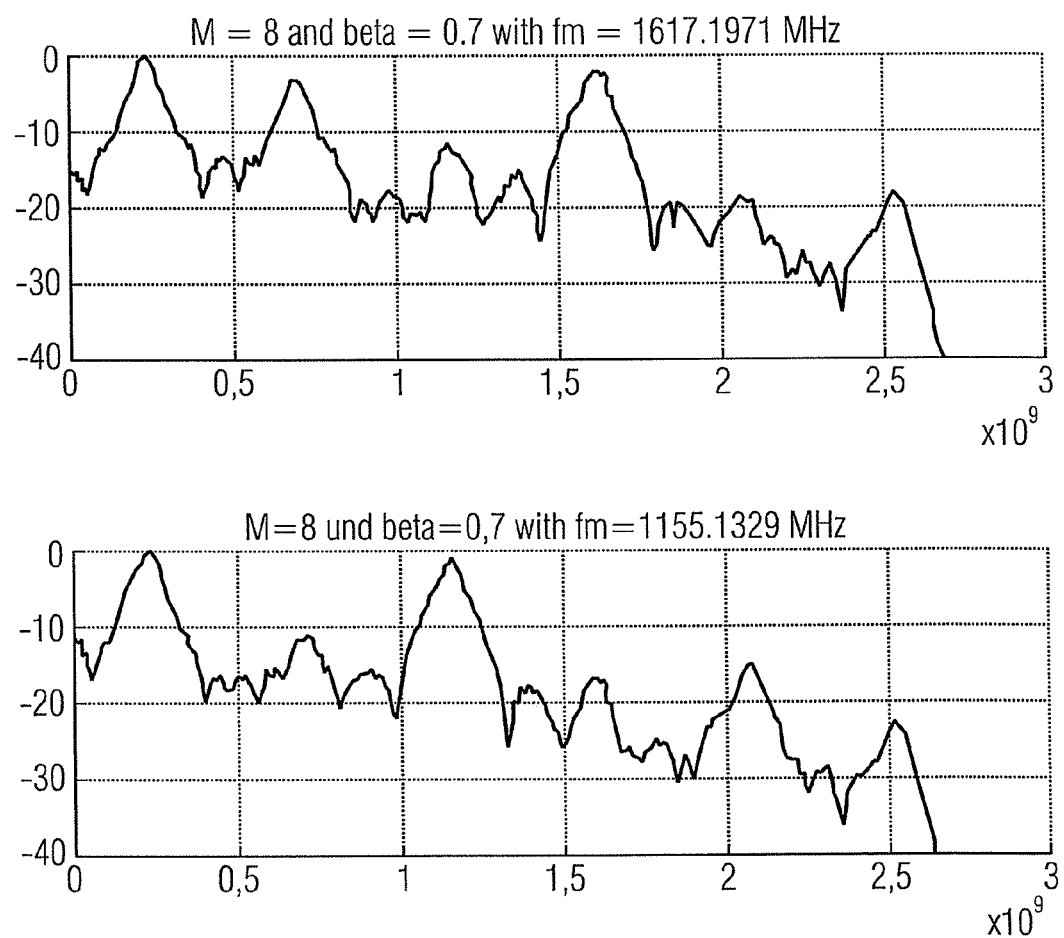
FIG. 6a shows a graph illustrating a transmission behavior of the mixer system shown in FIG. 5c.
Figure 6B:
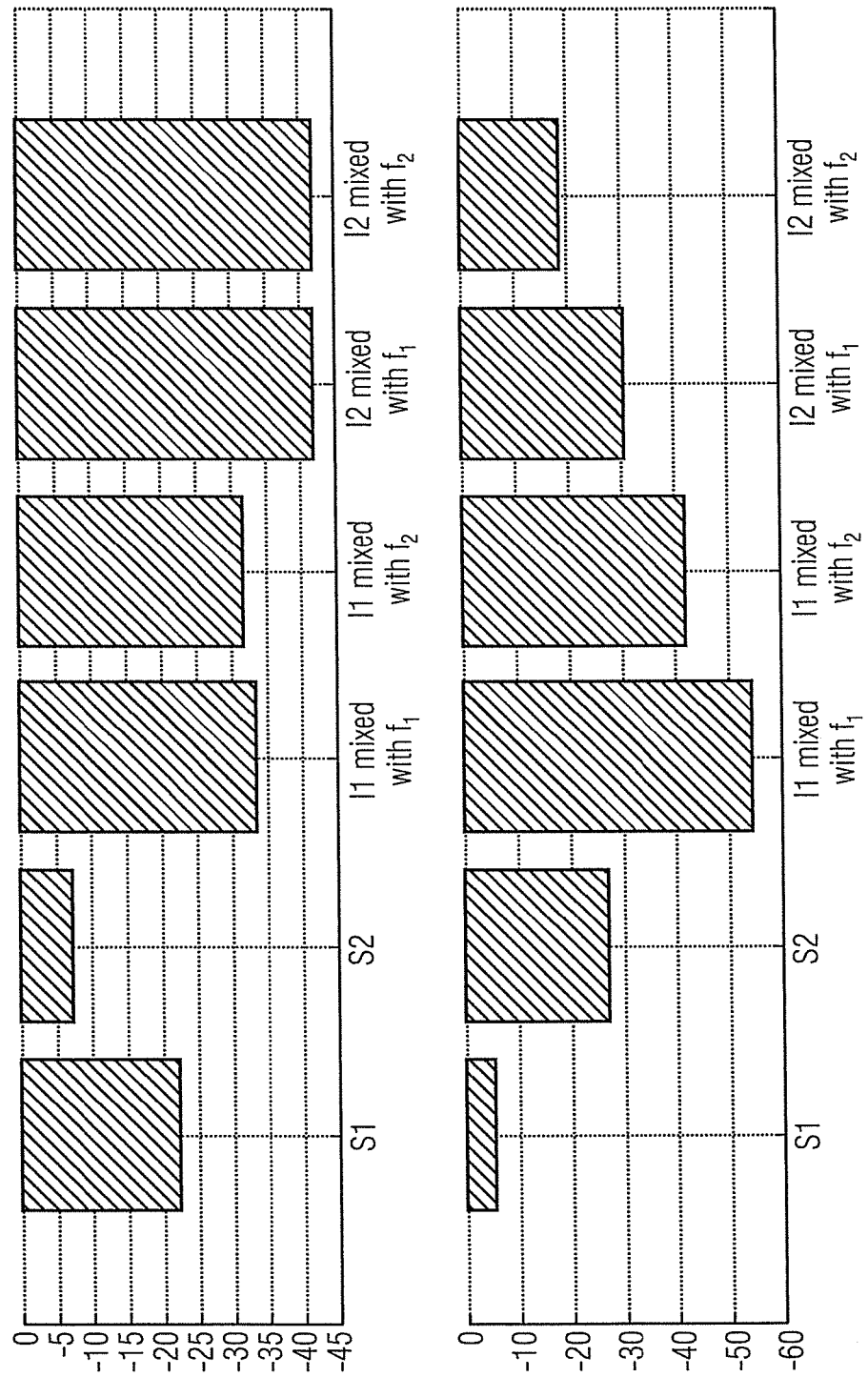
FIG. 6b shows a graph illustrating mirror frequency suppression behavior of the mixer system shown in FIG. 5c.

FIGS. 6a and 6b show simulation results of the mixer system 500, FIG. 6a showing a transmission behavior of the mixer system 500.

What is significantly more important is the mirror frequency suppression behavior, since the noise has a direct effect on the low frequencies of the system (LF).

FIG. 6b shows the mirror frequency suppression behavior of the mixer system 500. S1 and S2 are the signal bands, and I1 and I2 are the mirror bands mixed to the signal bands S1 and S2.

Figure 7:
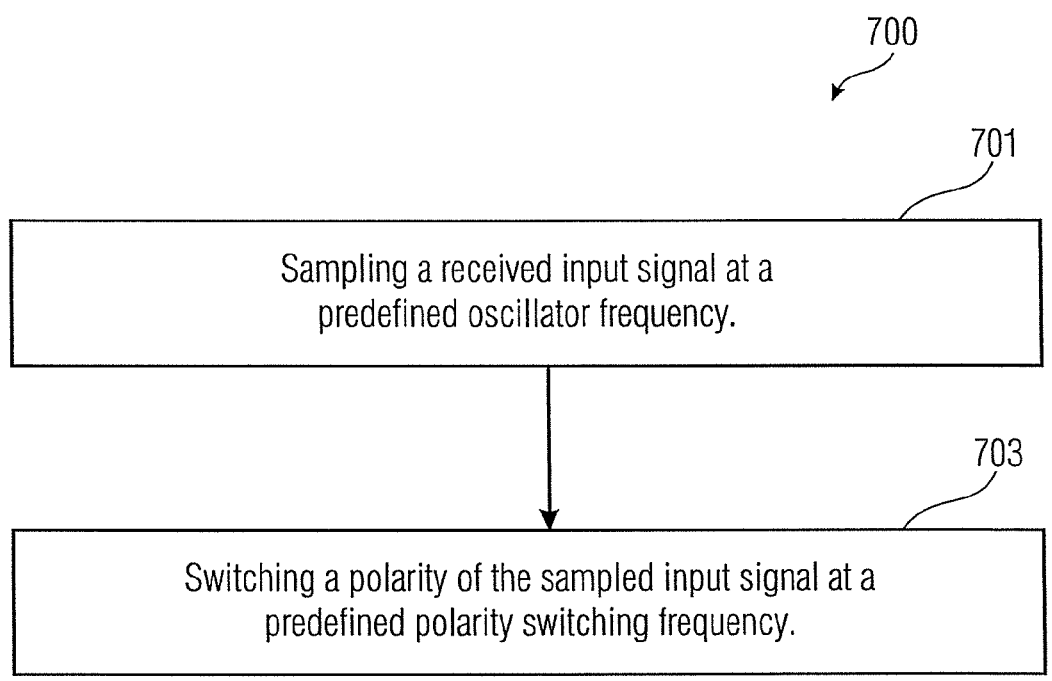
FIG. 7 shows a flowchart of a method in accordance with an embodiment.

FIG. 7 shows a flowchart of a method 700 in accordance with a further embodiment.

The method 700 comprises a step 701 of sampling a received input signal at a predefined oscillator frequency.

In addition, the method 700 comprises a step 703 of switching a polarity of the sampled input signal at a predefined polarity switching frequency.

Both steps 701 and 703 may be performed both one after the other and simultaneously.

In addition, the method may be performed by a mixer in accordance with an embodiment, for example by the mixer 100.

In accordance with further embodiments, a first data signal having a first frequency range and a second data signal having a second frequency range may be contained within the receive signal. The oscillator frequency and the polarity switching frequency may be selected such that the first frequency range lies within a predefined frequency range around a positive difference between the oscillator frequency and the polarity switching frequency, and that the second frequency range lies within a predefined frequency range around a sum of the oscillator frequency and the polarity switching frequency (cf. also FIG. 3c and the pertinent description).

The predefined frequency ranges around the positive difference between the oscillator frequency and the polarity switching frequency and around the sum of the oscillator frequency and the polarity switching frequency may be smaller, in particular, than a range from a lower cutoff frequency of the first frequency range of the first data signal and an upper cutoff frequency of the second frequency range of the second data signal.

In accordance with further embodiments, in cases wherein a center frequency of the first frequency range is smaller than a center frequency of the second frequency range, and wherein the first frequency range and the second frequency range are disjoint, i.e. no frequencies of the first frequency range are contained within the second frequency range, and vice versa, a bandwidth of the predefined frequency range around the sum of the oscillator frequency and the polarity switching frequency and of the predefined frequency range around the positive difference between the oscillator frequency and the polarity switching frequency may be a pass bandwidth of a filter for the sampled input signal. The pass bandwidth of the filter may be selected to be smaller than an amount of a difference between a lower limit of a first frequency range and an upper limit of the second frequency range. For example, the pass bandwidth of the filter may be selected to be larger, by a maximum of 50%, 25% or 10%, than the larger frequency range of the first and second frequency ranges.

In accordance with further embodiments, the pass bandwidth of the filter may also be selected to be larger, by a maximum of 25%, 15% or 5%, than a sum of the bandwidths of the two frequency ranges.

In embodiments, transistors may be field-effect transistors, metal-oxide semiconductor field-effect transistors (MOSFETs) or bipolar transistors, for example.

In addition, in embodiments, a switch may be implemented with transistors, for example in the form of one-transistor switches or so-called transmission gates (transmission switches), relays.

A source terminal of a transistor may be a source or an emitter of the transistor, for example, a drain terminal may be a drain or a collector of the transistor, for example, and a control terminal may be a gate or a base of the transistor, for example. A switching path or switchable path of a transistor may therefore form, e.g., a drain-source path of the transistor or an emitter-collector path of the transistor, for example.

In the present application, a direct low-resistance coupling and an indirect coupling to one or more components connected therebetween is understood to mean that a signal at a second circuit node is dependent on a signal at a first circuit node coupled to the second circuit node. In other words, further components may be connected between the two mutually coupled terminals, in particular passive components or switching paths of active components, such as of switches or transistors, for example. With mutually coupled terminals, a component may, but need not, be connected between said terminals, so that two mutually coupled terminals may also be directly connected to each other (i.e. by means of a low-resistance conducting connection).

In addition, in accordance with the present application, a first terminal is directly connected to a second terminal when a signal present at the second terminal is identical with a signal present at the first terminal, it being intended to leave parasitic effects or minor losses due to conductor resistances out of consideration. Therefore, two terminals that are directly connected to each other are typically connected via conductor traces or wires, without any additional components being connected therebetween.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device. Some or all of the method steps may be performed by a hardware device (or by using a hardware device) such as a microprocessor, a programmable computer or an electronic circuit, for example. In some embodiments, some or several of the most important method steps may be performed by such a device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A mixer configured to sample a received input signal at a predefined oscillator frequency to generate a sampled input signal, and switch a polarity of the sampled input signal at a predefined polarity switching frequency to generate a polarity switched sampled input signal, wherein the polarity of the polarity switched sampled input signal is maintained as compared to the received input signal in a first polarity state and is reversed as compared to the received input signal in a second polarity state, wherein the first polarity state and the second polarity state switch between each other according to the predefined polarity switching frequency, wherein the oscillator frequency is selected to be a multiple or an integer multiple of the polarity switching frequency; and wherein the mixer is configured to switch the polarity of the sampled input signal at points in time when the input signal is received at an input of the mixer and an output of the mixer at which the sampled input signal is provided is decoupled from each other.

2. The mixer as claimed in claim 1, wherein the predefined oscillator frequency is different from the predefined polarity switching frequency.

3. The mixer as claimed in claim 1, configured to couple, during sampling, an input of the mixer at which the input signal is received to an output of the mixer at which the sampled input signal is provided in a first state, and to decouple the input of the mixer from the output of the mixer in a second state.

4. The mixer as claimed in claim 3, configured to switch between the first state and the second state at the oscillator frequency.

5. A mixer configured to sample a received input signal at a predefined oscillator frequency to generate a sampled input signal, and switch a polarity of the sampled input signal at a predefined polarity switching frequency to generate a polarity switched sampled input signal, configured to simultaneously receive a first data signal comprising a first frequency range and a second data signal comprising a second frequency range;

the first data signal and the second data signal being comprised by the input signal received; and wherein the oscillator frequency and the polarity switching frequency are selected such that the first frequency range lies within a predefined frequency range around a positive difference between the oscillator frequency and the polarity switching frequency, and that the second frequency range lies within a predefined frequency range around a sum of the oscillator frequency and the polarity switching frequency.

6. The mixer as claimed in claim 5, wherein a bandwidth of the predefined frequency range around the sum of the oscillator frequency and the polarity switching frequency, and a bandwidth of the predefined frequency range around the positive difference between the oscillator frequency and the polarity switching frequency equal a pass bandwidth of a filter of the mixer for filtering the sampled input signal.

7. The mixer as claimed in claim 6, wherein a center frequency of the first frequency range is smaller than a center frequency of the second frequency range;

wherein the first frequency range and the second frequency range are disjoint; and wherein the pass bandwidth of the filter is smaller than an amount of a difference between a lower limit of the first frequency range and an upper limit of the second frequency range.

8. A mixer configured to sample a received input signal at a predefined oscillator frequency to generate a sampled input signal, and switch a polarity of the sampled input signal at a predefined polarity switching frequency to generate a polarity switched sampled input signal, the mixer comprising a mixer stage configured to receive the input signal and provide the sampled input signal; and
further comprising an oscillator circuit configured to provide to the mixer stage an oscillator signal comprising the oscillator frequency and a polarity switching signal comprising the polarity switching frequency;
wherein the mixer stage is configured to provide the polarity switched sampled input signal based on the oscillator signal and the polarity switching signal,
wherein the oscillator circuit is configured to keep constant a phase relationship between the oscillator signal and the polarity switching signal, and
wherein the oscillator circuit is configured to provide the oscillator signal and the polarity switching signal such that a state change of the polarity switching signal will occur only at points in time when the oscillator signal is in a predefined state.

9. The mixer as claimed in claim 8, wherein the mixer stage is configured such that in a predefined state of the oscillator signal, an input of the mixer stage at which the input signal is received is decoupled from an output of the mixer stage at which the sampled input signal is provided.

10. The mixer as claimed in claim 8, wherein the oscillator circuit comprises a numerically controlled oscillator so as to provide the polarity switching signal such that the oscillator frequency is a multiple or an integer multiple of the polarity switching frequency.

11. A mixer configured to sample a received input signal at a predefined oscillator frequency to generate a sampled input signal, and switch a polarity of the sampled input signal at a predefined polarity switching frequency to generate a polarity switched sampled input signal, the mixer comprising a capacitance network for holding the polarity switched sampled input signal,
configured to simultaneously receive a first data signal comprising a first frequency range and a first center frequency, and a second data signal comprising a second frequency range and a second center frequency;
the first data signal and the second data signal being comprised by the input signal;
the second center frequency being higher than the first center frequency; and
a capacitance of the capacitance network being selected such that a pass bandwidth of a filter resulting from the capacitance is smaller, for the sampled input signal, than an amount of a difference between a lower limit of the first frequency range and an upper limit of the second frequency range.

12. A mixer configured to sample a received input signal at a predefined oscillator frequency to generate a sampled input signal, and switch a polarity of the sampled input signal at a predefined polarity switching frequency to generate a polarity switched sampled input signal, the mixer comprising a capacitance network for holding the polarity switched sampled input signal; and
further comprising a mixer stage configured to receive the input signal and provide the polarity switched sampled input signal to the capacitance network; and wherein the capacitance network comprises a first capacitance permanently coupled to the mixer stage, and a second capacitance switchably coupled to the mixer stage.

13. The mixer as claimed in claim 12, wherein the capacitance network further comprises a third capacitance switchably coupled to the mixer stage; and
wherein the second capacitance and the third capacitance are switched to be complementary to each other such that in a first phase wherein the second capacitance is coupled to the mixer stage, the third capacitance is decoupled from the mixer stage, and such that in a second phase wherein the second capacitance is decoupled from the mixer stage, the third capacitance is coupled to the mixer stage.

14. The mixer as claimed in claim 12, configured such that switching of the second capacitance from a first phase wherein the second capacitance is coupled to the mixer stage to a second phase wherein the second capacitance is decoupled from the mixer stage will occur only at such points in time when an output of the mixer stage at which the sampled input signal is provided is decoupled from an input of the mixer stage at which the input signal is received.

15. A mixer system comprising:
a plurality of mixers, each of the mixers being configured to sample a received input signal at a predefined oscillator frequency to generate a sampled input signal and switch a polarity of the sampled input signal at a predefined polarity switching frequency to generate a polarity switched sampled input signal;
a clock provider for providing to each mixer among the plurality of mixers an oscillator signal comprising the predefined oscillator frequency and a polarity switching signal comprising the predefined polarity switching frequency;
wherein oscillator signals for different mixers are shifted in phase in relation to one another; and
wherein polarity switching signals for different mixers are shifted in phase in relation to one another.

16. The mixer system as claimed in claim 15, wherein the oscillator frequency is different from the polarity switching frequency.

17. The mixer system as claimed in claim 15, wherein the clock provider is configured to provide each of the mixers with its oscillator signal and its polarity switching signal such that a state change of a polarity switching signal of a mixer will occur only when the oscillator signal of the mixer comprises a predefined state wherein an output of the mixer at which the mixer provides its sampled input signal is decoupled from an input of the mixer at which the mixer receives the input signal.

18. The mixer system as claimed in claim 15, wherein each of the mixers receives the same input signal.

19. A method comprising:
sampling a received input signal at a predefined oscillator frequency to generate a sampled input signal; and
switching a polarity of the sampled input signal at a predefined polarity switching frequency to generate a polarity switched sampled input signal;
wherein a first data signal comprising a first frequency range and a second data signal comprising a second frequency range are comprised by the receive signal; and
wherein the oscillator frequency and the polarity switching frequency are selected such that the first frequency range lies within a predefined frequency range around a positive difference between the oscillator frequency and the polarity switching frequency, and such that the second frequency range lies within a predefined frequency range around a sum of the oscillator frequency and the polarity switching frequency.

20. The method as claimed in claim 19, wherein a center frequency of the first frequency range is smaller than a center frequency of the second frequency range, and the first frequency range and the second frequency range are disjoint;
   wherein a bandwidth of the predefined frequency range around the sum of the oscillator frequency and the polarity switching frequency and a bandwidth of the predefined frequency range around the positive difference between the oscillator frequency and the polarity switching frequency are equal to a pass bandwidth of a filter for the sampled input signal; and
   wherein the pass bandwidth of the filter is smaller than an amount of a difference between a lower limit of the first frequency range and an upper limit of the second frequency range.

21. A mixer comprising:
   a sampling stage configured to sample a received input signal at a predefined oscillator frequency of an applied oscillator signal, and to maintain, during sampling, a polarity of the sampled input signal with regard to the received input signal when the oscillator signal is present at a first oscillator signal input of the sampling stage, and to switch, during sampling, a polarity of the sampled input signal with regard to the received input signal when the oscillator signal is present at a second oscillator signal input of the sampling stage; and
   a switching signal provider configured to alternately apply the oscillator signal comprising a predefined polarity switching frequency at the first oscillator signal input of the sampling stage and at the second oscillator signal input of the sampling stage.

* * * * *